(12) United States Patent
Sasaki

(10) Patent No.: US 8,116,113 B2
(45) Date of Patent: Feb. 14, 2012

(54) CROSS-POINT SEMICONDUCTOR MEMORY DEVICE AND METHOD OF MANUFACTURING THE SAME

(75) Inventor: Masayoshi Sasaki, Tokyo (JP)

(73) Assignee: Sony Corporation (JP)

(*) Notice: Subject to any disclaimer, the term of this patent is extended or adjusted under 35 U.S.C. 154(b) by 206 days.

(21) Appl. No.: 12/657,367

(22) Filed: Jan. 19, 2010

(65) Prior Publication Data

US 2010/0188879 A1    Jul. 29, 2010

(30) Foreign Application Priority Data

Jan. 21, 2009  (JP) ................ P2009-010623

(51) Int. Cl.
*G11C 5/06* (2006.01)
(52) U.S. Cl. .......................... 365/63; 365/51
(58) Field of Classification Search .......... 365/63, 365/51, 158
See application file for complete search history.

(56) References Cited

U.S. PATENT DOCUMENTS

| 5,289,037 | A | * | 2/1994 | Savignac et al. ........... 257/776 |
| 5,761,115 | A | | 6/1998 | Kozicki et al. |
| 5,896,312 | A | | 4/1999 | Kozicki et al. |
| 5,914,893 | A | | 6/1999 | Kozicki et al. |
| 6,693,821 | B2 | | 2/2004 | Hsu et al. |
| 6,806,525 | B2 | * | 10/2004 | Takeuchi et al. ........... 257/296 |
| 6,858,905 | B2 | | 2/2005 | Hsu et al. |
| 6,927,998 | B2 | * | 8/2005 | Takeuchi et al. ........... 365/185.02 |
| 7,126,152 | B2 | | 10/2006 | Ishida et al. |
| 7,436,704 | B2 | | 10/2008 | Kim et al. |
| 2005/0226036 | A1 | | 10/2005 | Aratani et al. |

FOREIGN PATENT DOCUMENTS

| JP | 04-125962 | 4/1992 |
| JP | 2002-508595 | 9/1999 |
| JP | 2003-068983 A | 3/2003 |
| JP | 2004027877 A | 1/2004 |
| JP | 2005-166976 A | 6/2005 |
| JP | 2005-197634 A | 7/2005 |
| JP | 2005-322942 A | 11/2005 |
| JP | 2007-134676 A | 5/2007 |
| JP | 2008165970 A | 7/2008 |
| WO | 9949518 A1 | 9/1999 |
| WO | 02067320 A1 | 8/2002 |

OTHER PUBLICATIONS

Office Action from Japanese Application No. 2009-010623, dated Mar. 8, 2011.

* cited by examiner

*Primary Examiner* — Son Dinh
(74) *Attorney, Agent, or Firm* — Lerner, David, Littenberg, Krumholz & Mentlik, LLP

(57) ABSTRACT

A cross-point semiconductor memory device includes: a plurality of first wirings extending in a first direction; a plurality of second wirings positioned on a layer different from the first wirings to extend in a second direction different from the first direction; and memory parts provided in overlap areas of the first wirings and the second wirings, wherein the odd-numbered first wirings and the even-numbered first wirings are arranged on different insulating interlayers in an up-down direction.

16 Claims, 26 Drawing Sheets

[STEP-110]

[STEP-120]

[STEP-130]

[STEP-140A]

[STEP-140A] (CONTINUATION)

[STEP-140B]

[STEP-140] (CONTINUATION)

[STEP-140C]

[STEP-140C] (CONTINUATION)

[STEP-150]

[STEP-150]

[STEP-150]

[STEP-150]

FIRST DIRECTION
⊗
SECOND DIRECTION

[STEP-220]

[STEP-220] (CONTINUATION)

[STEP-230]

[STEP-230] (CONTINUATION)

[STEP-230] (CONTINUATION)

CROSS-POINT SEMICONDUCTOR MEMORY DEVICE AND METHOD OF MANUFACTURING THE SAME

CROSS-REFERENCE TO RELATED APPLICATION

The present application claims priority from Japanese Patent Application No. JP 2009-010623 filed in the Japanese Patent Office on Jan. 21, 2009, the entire content of which is incorporated herein by reference.

BACKGROUND OF THE INVENTION

1. Field of the Invention

The present invention relates to a cross-point semiconductor memory device and a method of manufacturing the same.

2. Description of the Related Art

A most common semiconductor nonvolatile memory is a flash memory, and a NOR flash memory or a NAND flash memory is widely used for code storage or data storage. In recent years, a new nonvolatile memory, for example, a resistance-change memory including a phase-change memory (Phase change RAM, PRAM) is suggested as an alternative to a flash memory. This nonvolatile memory has a structure in which a memory part is arranged between upper and lower electrodes, so it has a simple memory structure and can be easily miniaturized. A phase-change memory that is one of a resistance-change memory is a nonvolatile memory in which a phase-change material for a memory part whose electrical resistance varies between an amorphous state and a crystalline state by several digits is used for an operation as a memory (for example, see JP-A-2007-134676). As a type of resistance-change memory, a nonvolatile memory is suggested in which data is stored by a colossal magneto-resistance effect (CMR effect) of a storage material forming a memory part (for example, see JP-A-2003-068983). Alternatively, as a type of resistance-change memory, a nonvolatile memory is suggested in which a memory part is made of an ion conductor containing a metal (for example, JP-A-2005-166976 or JP-A-2005-197634). In addition, as a type of resistance-change memory, a PMC (Programmable Metallization Cell) is suggested (for example, see JP-A-2005-322942).

With regard to these nonvolatile memories, there is an effort to increase integration, and studies are being conducted for a so-called cross-point semiconductor memory device. The cross-point semiconductor memory device includes bit lines, word lines, and memory parts arranged at intersections (cross-points, overlap areas) between the bit lines and the words lines, and made of a storage material for storing data. Then, data stored in a memory cell positioned at an intersection between the selected bit and word lines is directly read without using a selection transistor. The cross-point semiconductor memory device has a simple structure, so in terms of achievement of high capacity, the cross-point semiconductor memory device is attracting attention. As the memory part constituting the cross-point semiconductor memory device, the above-described resistance-change memory is suggested.

FIG. 26 shows an arrangement example of word lines, bit lines, and memory parts in a cross-point semiconductor memory device. The word lines and the bit lines are arranged in a line-and-stripe shape in a direction in which the projection images thereof are orthogonal to each other. The minimum size of one memory cell including a word line, a bit line, and a memory part arranged at an intersection between the word and bit lines is $4F^2$. "F" means a minimum process dimension defined by the design rule of a manufacturing process for manufacturing a cross-point semiconductor memory device (a minimum line width dimension and a minimum interval dimension under the restriction of the manufacturing process). The minimum process dimension F is a dimension that is usually restricted by resolution ability of photolithography. That is, the minimum value of the width of the bit line or word line and the wiring interval is "F", so the minimum size of the memory cell is $4F^2$.

SUMMARY OF THE INVENTION

However, in the cross-point semiconductor memory device, there is a strong demand for making the size of one memory cell less than $4F^2$.

Thus, it is desirable to provide a cross-point semiconductor memory device having a configuration or structure in which the size of one memory cell is less than $4F^2$, and a method of manufacturing the same.

An embodiment of the invention provides a cross-point semiconductor memory device. The cross-point semiconductor memory device includes (A) a plurality of first wirings extending in a first direction, (B) a plurality of second wirings positioned on a layer different from the first wirings to extend in a second direction different from the first direction, and (C) memory parts provided in overlap areas of the first wirings and the second wirings. The odd-numbered first wirings and the even-numbered first wirings are arranged on different insulating interlayers in an up-down direction.

Another embodiment of the invention provides a method of manufacturing a cross-point semiconductor memory device. The cross-point semiconductor memory device includes (A) a plurality of first wirings extending in a first direction, (B) a plurality of second wirings positioned on a layer different from the first wirings to extend in a second direction different from the first direction, and (C) memory parts provided in overlap areas of the first wirings and the second wirings. The odd-numbered first wirings and the even-numbered first wirings are arranged on different insulating interlayers in an up-down direction. The first wirings are positioned below the second wirings. The arrangement state of the odd-numbered first wirings and the arrangement state of the even-numbered first wirings are out of alignment by half of an arrangement pitch of the odd-numbered and even-numbered first wirings, respectively. The method includes the steps of (a) forming drive transistors on a semiconductor substrate, (b) forming a first insulating interlayer on the entire surface and forming the odd-numbered first wirings electrically connected to the odd-numbered drive transistors on the first insulating interlayer, (c) forming a second insulating interlayer on the entire surface and forming the even-numbered first wirings electrically connected to the even-numbered drive transistors on the second insulating interlayer, (d) forming a third insulating interlayer on the entire surface, (e) forming first openings in the second insulating interlayer and the third insulating interlayer above the odd-numbered first wirings, forming first sidewalls at the sidewall parts of the first openings to reduce the diameter of the first openings, forming second openings in the third insulating interlayer above the even-numbered first wirings, forming second sidewalls at the sidewall parts of the second openings to reduce the diameter of the second openings, filling a conductive material in the first openings to form first connection holes, and filling a conductive material in the second openings to form second connection holes, and (f) forming the memory parts and the second wirings on the third insulating interlayer so as to seal the first connection holes and the second connection holes.

With the cross-point semiconductor memory device and the method of manufacturing the same according to the embodiment of the invention, the odd-numbered first wirings and the even-numbered first wirings are arranged on different insulating interlayers in an up-down direction. Therefore, when a memory part is formed with a pitch of a minimum process dimension defined by the design rule of the manufacturing process, the odd-numbered first wirings can have a pitch $P_1$ of 2F, and the even-numbered first wirings can have a pitch $P_1$ of 2F. That is, when the first wirings are viewed as a whole, the pitch of the first wirings can be made F. As a result, the memory cells having the first wirings, the memory parts, and the second wirings can have a size of $2F^2$, and a high-density semiconductor memory device can be realized.

DETAILED DESCRIPTION OF THE INVENTION

Figure 1A:
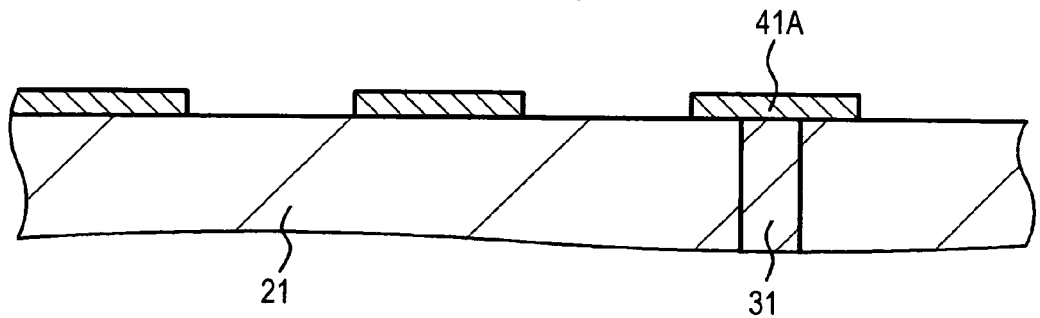
FIGS. 1A to 1C are schematic partial sectional views of a first insulating interlayer and the like illustrating a method of manufacturing a cross-point semiconductor memory device according to Embodiment 1.
Figure 1B:
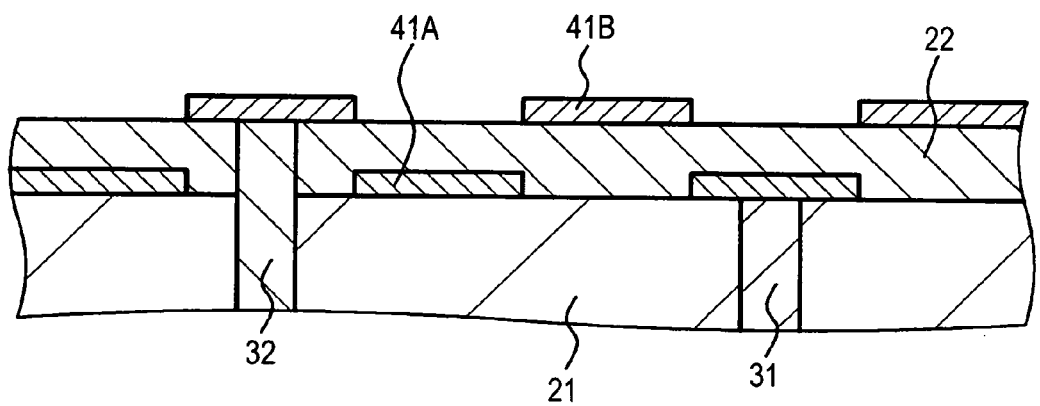

Hereinafter, embodiments of the invention will be described with reference to the drawings, but the invention is not limited to the embodiments. In the embodiments, various numerical values or materials are for illustration. The description will be made in the following sequence.

1. Overall description of cross-point semiconductor memory device and method of manufacturing the same according to embodiments of the invention 2. Embodiment 1 (cross-point semiconductor memory device and method of manufacturing the same according to the invention)

3. Embodiment 2 (modification of Embodiment 1)
4. Embodiment 3 (another modification of Embodiment 1 and others)

Overall Description of Cross-Point Semiconductor Memory Device and Method of Manufacturing the Same According to Embodiments of the Invention According to a cross-point semiconductor memory device or a method of manufacturing the same of embodiments of the invention, first wirings extend in a first direction and second wirings extend in a second direction, specifically, projection images of the first wirings and projection images of the second wirings are orthogonal to each other. With regard to the odd-numbered first wirings and the even-numbered first wirings, the odd-numbered first wirings may become the even-numbered first wirings and the even-numbered first wirings may become the odd-numbered first wirings depending on how the first wirings are counted. In such a case, it should suffice that the even-numbered first wirings are read as the odd-numbered first wirings, and the odd-numbered first wirings are read as the even-numbered first wirings. Similarly, with regard to the odd-numbered second wirings and the even-numbered second wirings, the odd-numbered second wirings may become the even-numbered second wirings and the even-numbered second wirings may become the odd-numbered second wirings depending on how the second wirings are counted. In such a case, it should also suffice that the even-numbered second wirings are read as the odd-numbered second wirings, and the odd-numbered second wirings are read as the even-numbered second wirings.

In the method of manufacturing a cross-point semiconductor memory device of the embodiment of the invention, a step (e) includes the following six steps:

(e-1) forming first openings in a second insulating interlayer and a third insulating interlayer above the odd-numbered first wirings;

(e-2) forming first sidewalls at the sidewall parts of the first openings to reduce the diameter of the first openings;

(e-3) forming second openings in the third insulating interlayer above the even-numbered first wirings;

(e-4) forming second sidewalls at the sidewall parts of the second openings to reduce the diameter of the second openings;

(e-5) filling a conductive material in the first openings to form first connection holes; and (e-6) filling a conductive material in the second openings to form second connection holes.

These steps are executed in the following sequence, for example:

(e-1)→(e-2)→(e-3)→(e-4)→(e-5)→(e-6)
(e-1)→(e-2)→(e-3)→(e-4)→(e-6)→(e-5)
(e-1)→(e-2)→(e-3)→(e-4)→(e-5) and (e-6)
(e-3)→(e-4)→(e-1)→(e-2)→(e-5)→(e-6)
(e-3)→(e-4)→(e-1)→(e-2)→(e-6)→(e-5)
(e-3)→(e-4)→(e-1)→(e-2)→(e-5) and (e-6)
(e-1)→(e-2)→(e-5)→(e-3)→(e-4)→(e-6)
(e-3)→(e-4)→(e-6)→(e-1)→(e-2)→(e-5)

The cross-point semiconductor memory device of the embodiment of the invention or a cross-point semiconductor memory device obtained by the method of manufacturing a cross-point semiconductor memory device of the embodiment of the invention (hereinafter, collectively referred to as "the cross-point semiconductor memory device of the invention and the like") can be configured such that the arrangement state of the odd-numbered first wirings and the arrangement state of the even-numbered first wirings are out of alignment by half of an arrangement pitch ($P_1$) of the odd-numbered and even-numbered first wirings, respectively, and the arrangement pitch ($P_1$) of the odd-numbered or even-numbered first wirings is two times larger than a minimum process dimension F. That is, it is desirable that the odd-numbered first wirings may have a width equal to the minimum process dimension F, a distance between the first wirings may be equal to the minimum process dimension F, the even-numbered first wirings may have a width equal to the minimum process dimension F, and a distance between the first wirings may be equal to the minimum process dimension F. Alternatively, the cross-point semiconductor memory device of the invention and the like may be configured such that projection images of the odd-numbered first wirings and projection images of the even-numbered first wirings do not overlap each other and have no gap.

In the cross-point semiconductor memory device of the invention and the like including the above-described preferable configuration, the first wirings may be positioned below the second wirings, adjacent memory parts in the second direction may be connected to each other by a memory extension part, and the second wirings and the memory layer having the memory parts and the memory extension parts may have a laminated structure. For convenience, this configuration is called "a cross-point semiconductor memory device according to a first embodiment and the like". In this case, the memory layer is a lower layer, and the second wirings are an upper layer.

The cross-point semiconductor memory device according to the first embodiment and the like may further include drive transistors connected to the first wirings and formed on a semiconductor substrate. The odd-numbered first wirings may be formed on a first insulating interlayer covering the drive transistors. The even-numbered first wirings may be formed on a second insulating interlayer covering the first insulating interlayer and the odd-numbered first wirings. A memory layer may be formed on a third insulating interlayer covering the second insulating interlayer and the even-numbered first wirings. The odd-numbered first wirings and the memory parts may be connected to each other through first connection holes provided in the second insulating interlayer and the third insulating interlayer. The even-numbered first wirings and the memory parts may be connected to each other through second connection holes provided in the third insulating interlayer. In such a configuration, the first connection holes and the second connection holes may function as diodes depending on the configuration of the memory part, and the first connection holes and the second connection holes may be simply buried with conductive materials. In the former case, the first connection holes and the second connection holes may each have a semiconductor layer area containing an impurity of a first conduction type (for example, a semiconductor layer area containing a p-type impurity or an n-type impurity) and a semiconductor layer area containing an impurity of a second conduction type different from the first conduction type (for example, a semiconductor layer area containing an n-type impurity or a p-type impurity). In such a configuration including these arrangements, each of the drive transistors may be a field effect transistor (FETs). The width of a channel forming area of the drive transistor may be at least 1.5 times (specifically, at least "3F") larger than the arrangement pitch (specifically, for example, "2F") of the odd-numbered or even-numbered first wirings. A width direction of the channel forming area of the drive transistor may be parallel to the second direction. One source/drain area of the drive transistors may be connected to the odd-numbered first wirings through first connection parts provided in the first insulating interlayer or connected to the even-numbered first wirings through second connection parts provided in the first insulating interlayer and the second insulating interlayer (that is, one source/drain area of the odd-numbered drive transistors may be connected to the odd-numbered first wirings through the first connection parts provided in the first insulating interlayer, and one source/drain area of the even-numbered drive transistors may be connected to the even-numbered first wirings through the second connection parts provided in the first insulating interlayer and the second insulating interlayer), and the other source/drain area of the drive transistors may be connected to a power supply or grounded.

In the cross-point semiconductor memory device of the invention and the like having the above-described preferable configuration, the odd-numbered second wirings and the even-numbered second wirings may be arranged on different insulating interlayers in the up-down direction. For convenience, this arrangement is called "a cross-point semiconductor memory device according to a second embodiment and the like". In the cross-point semiconductor memory device according to the second embodiment and the like, the arrangement state of the odd-numbered second wirings and the arrangement state of the even-numbered second wirings may be out of alignment by half of an arrangement pitch ($P_2$) of the odd-numbered and even-numbered second wirings, respectively, and the arrangement pitch ($P_2$) of the odd-numbered or even-numbered second wirings may be two times larger than a minimum process dimension F. That is, it is desirable that the odd-numbered second wirings may have a width equal to the minimum process dimension F, a distance between the second wirings may be equal to the minimum process dimension F, the even-numbered second wirings may have a width equal to the minimum process dimension F, and a distance between the second wirings may be equal to the minimum process dimension F. Alternatively, the cross-point semiconductor memory device according to the second embodiment and the like may be configured such that projection images of the odd-numbered second wirings and projection images of the even-numbered second wirings do not overlap each other and have no gap.

In the cross-point semiconductor memory device according to the second embodiment and the like including the above-described preferable configuration, the first wirings may be positioned below the second wirings, and adjacent memory parts in the second direction may be connected to each other by a memory extension part. The memory parts and the memory extension parts form a memory layer.

In the cross-point semiconductor memory device according to the second embodiment and the like including the above-described configuration, the odd-numbered second wirings may be formed on the memory layer. A second memory layer and the even-numbered second wirings may be formed on a fourth insulating interlayer covering the odd-numbered second wirings and the third insulating interlayer. Memory parts composed of the second memory layer may be connected to the odd-numbered first wirings through third connection holes provided in the fourth insulating interlayer, the third insulating interlayer, and the second insulating interlayer, and the memory parts composed of the second memory layer may be connected to the even-numbered first wirings through fourth connection holes provided in the fourth insulating interlayer and the third insulating interlayer. In such a configuration, the third connection holes and the fourth connection holes may function as diodes depending on the configuration of the memory part, and the third connection holes and the fourth connection holes may be simply buried with conductive materials. In the former case, the third connection holes and the fourth connection holes may each have a semiconductor layer area containing an impurity of a first conduction type (for example, a semiconductor layer area containing a p-type impurity or an n-type impurity) and a semiconductor layer area containing an impurity of a second conduction type different from the first conduction type (for example, a semiconductor layer area containing an n-type impurity or a p-type impurity).

The third connection holes can be obtained by forming third openings in the portions of the second insulating interlayer, the third insulating interlayer, and the fourth insulating interlayer between the portions where the even-numbered second wirings are to be formed and the odd-numbered first wirings, forming third sidewalls at the sidewall parts of the third openings to reduce the diameter of the third openings, and filling a conductive material in the third openings to form the third connection holes. The fourth connection holes can be obtained by forming fourth openings in the portions of the third insulating interlayer and the fourth insulating interlayer between the portions where the even-numbered second wirings are to be formed and the even-numbered first wirings, forming fourth sidewalls at the sidewall parts of the fourth openings to reduce the diameter of the fourth openings, and filling a conductive material in the fourth openings to form the fourth connection holes.

In the cross-point semiconductor memory device of the invention and the like including various preferable configurations and arrangements described above, the first wirings, the memory parts, and the second wirings may form a phase-change memory (PRAM). In such an arrangement, the memory parts (memory layer or second memory layer) may be made of chalcogenide which is a compound of a metal and Se or Te, such as GeSbTe, ZnSe, GaSnTe, or the like. Alternatively, the memory parts (memory layer or second memory layer) may be made of a material having the CMR effect. In this case, examples of such a material include $PrCaMnO_3$. Alternatively, when the memory parts (memory layer or second memory layer) may be made of an ion conductor containing a metal, examples of such a material include a conductive or semiconductive thin film containing one element selected from Cu, Ag, and Zn and one element selected from chalcogenide elements, such as Te, S, and Se (for example, a thin film made of GeSbTe, GeTe, GeSe, GeS, SiGeTe, or SiGeSbTe, or a laminated film of this thin film and a thin film made of Ag, Ag alloy, Cu, Cu alloy, Zn, or Zn alloy). Alternatively, a film made of one selected from rare earth elements, such as La, Ce, Pr, Nd, Sm, Eu, Gd, Tb, Dy, Ho, Er, Yb, and Y, an oxide film (rare earth oxide film) containing plural kinds of rare earth elements, or an oxide film of Hf, Ta, W, or the like may be formed entirely or a portion in the thickness direction.

In the cross-point semiconductor memory device of the invention and the like, examples of the materials for the first wirings and the second wirings include, for example, tungsten (W), TiN, aluminum (Al), copper (Cu), molybdenum (Mo), titanium (Ti), tantalum (Ta), TiW, WN, and silicide. When the wirings may be made of, for example, tungsten (W), a cohesive layer made of Ti or TiN may be formed below the wirings. When the wirings have a laminated structure of a lower conductive material layer and an upper conductive material layer, the lower conductive material layer may be composed of a silicon layer (for example, a polysilicon layer or an amorphous silicon layer), and the upper conductive material layer may be composed of a nickel silicide layer, a nickel-platinum silicide layer, a cobalt silicide layer, or a titanium silicide layer. Examples of the material for an insulating interlayer (first insulating interlayer, second insulating interlayer, third insulating interlayer, and fourth insulating interlayer) include an SiO$_x$-based material, such as SiO$_2$, NSG (Non-doped Silicate Glass), BPSG (borophosphorous silicate glass), or PSG, an SiN$_Y$-based material, such as SiN, or SiON, and a low-dielectric-constant insulating material (for example, SiOC, SiOF, or fluorocarbon). The sidewalls may be made of these insulating materials, but a material having an etching selection ratio with respect to the insulating interlayer should be selected.

Embodiment 1

Figure 4:
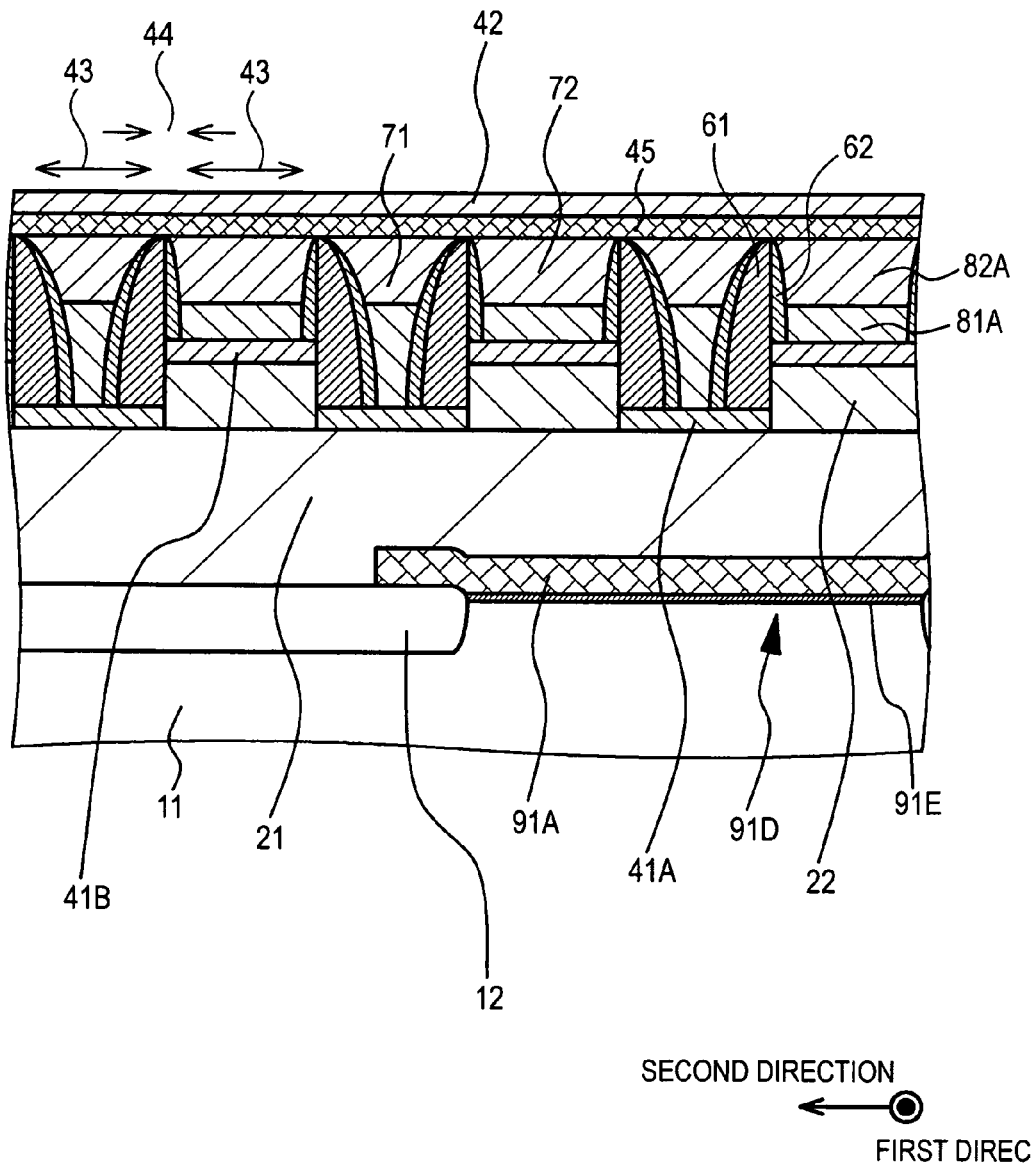
FIG. 4 is a schematic partial sectional view of the cross-point semiconductor memory device according to the Embodiment 1 along a second direction.
Figure 5:
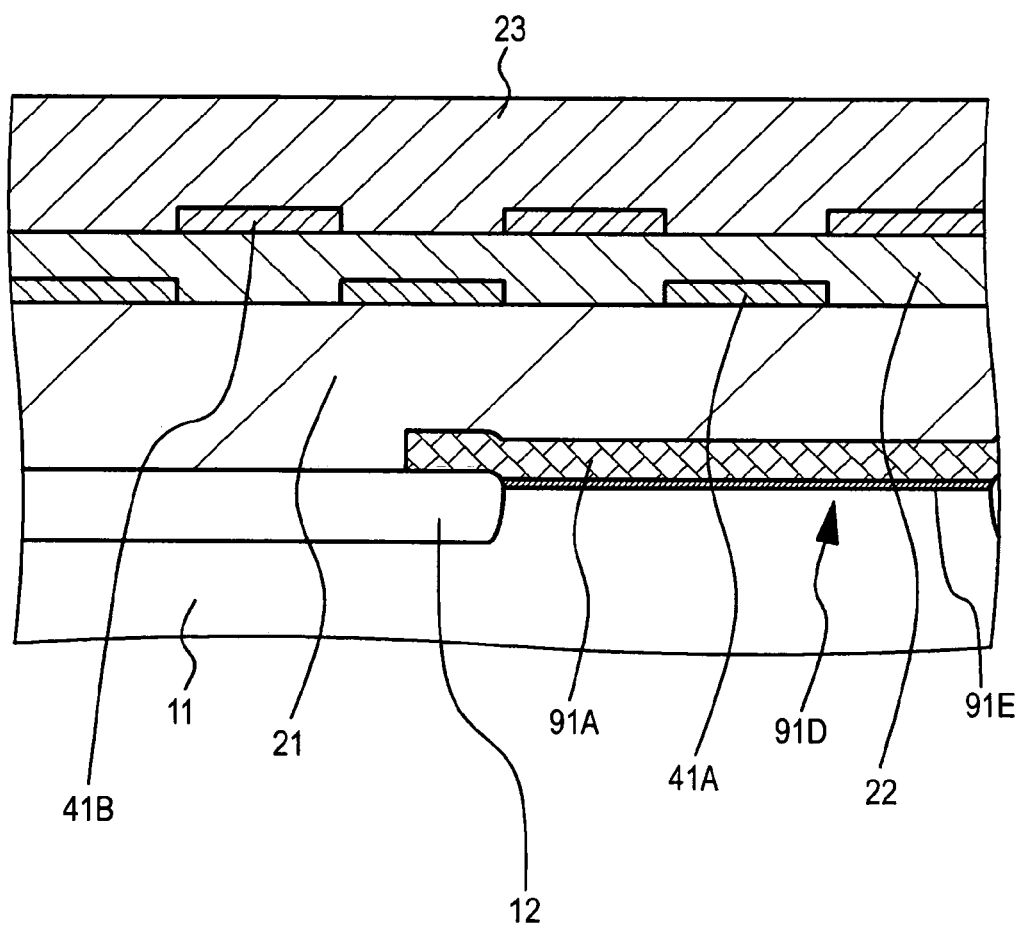
FIG. 5 is a schematic partial sectional view, different from FIG. 4, of the cross-point semiconductor memory device according to the Embodiment 1 along the second direction.
Figure 6:
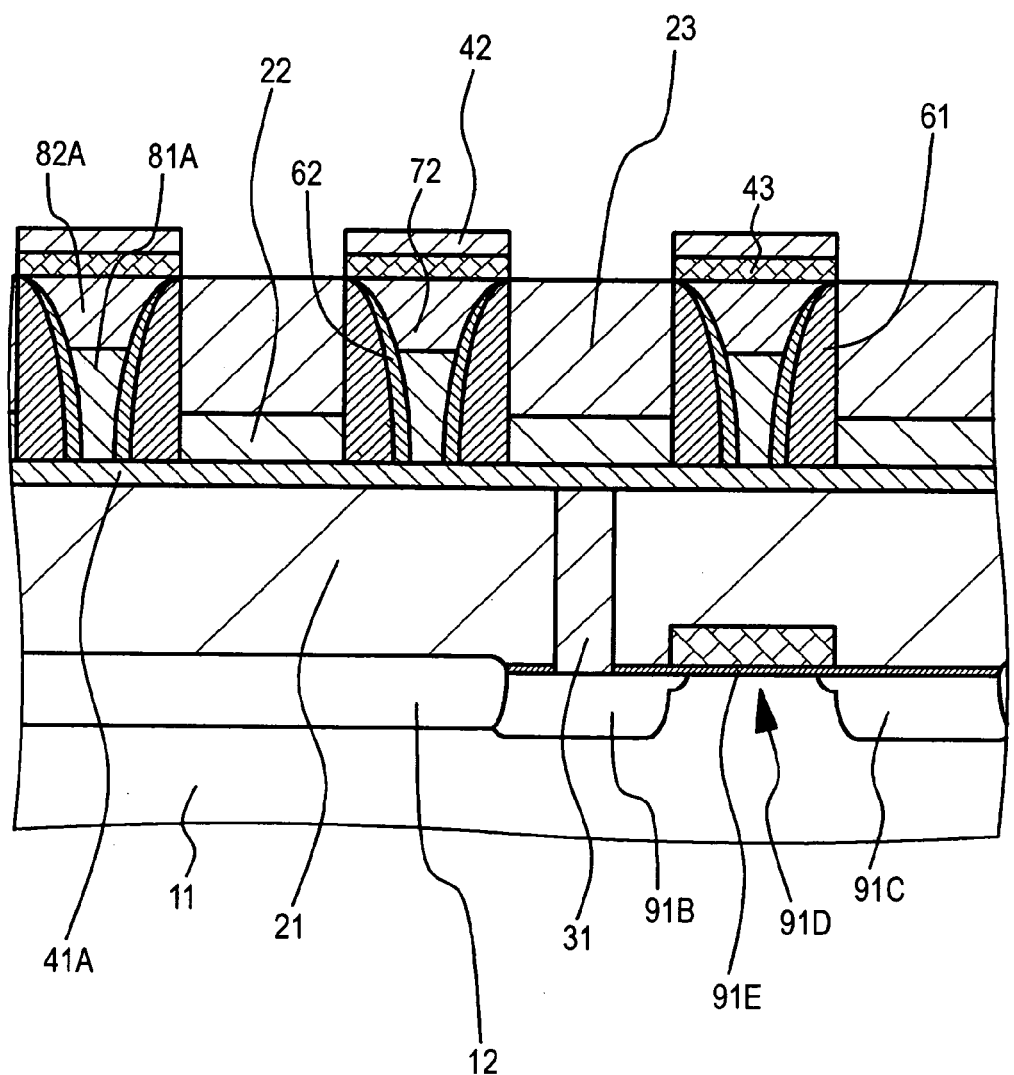
FIG. 6 is a schematic partial sectional view of the cross-point semiconductor memory device according to the Embodiment 1 along a first direction.
Figure 7:
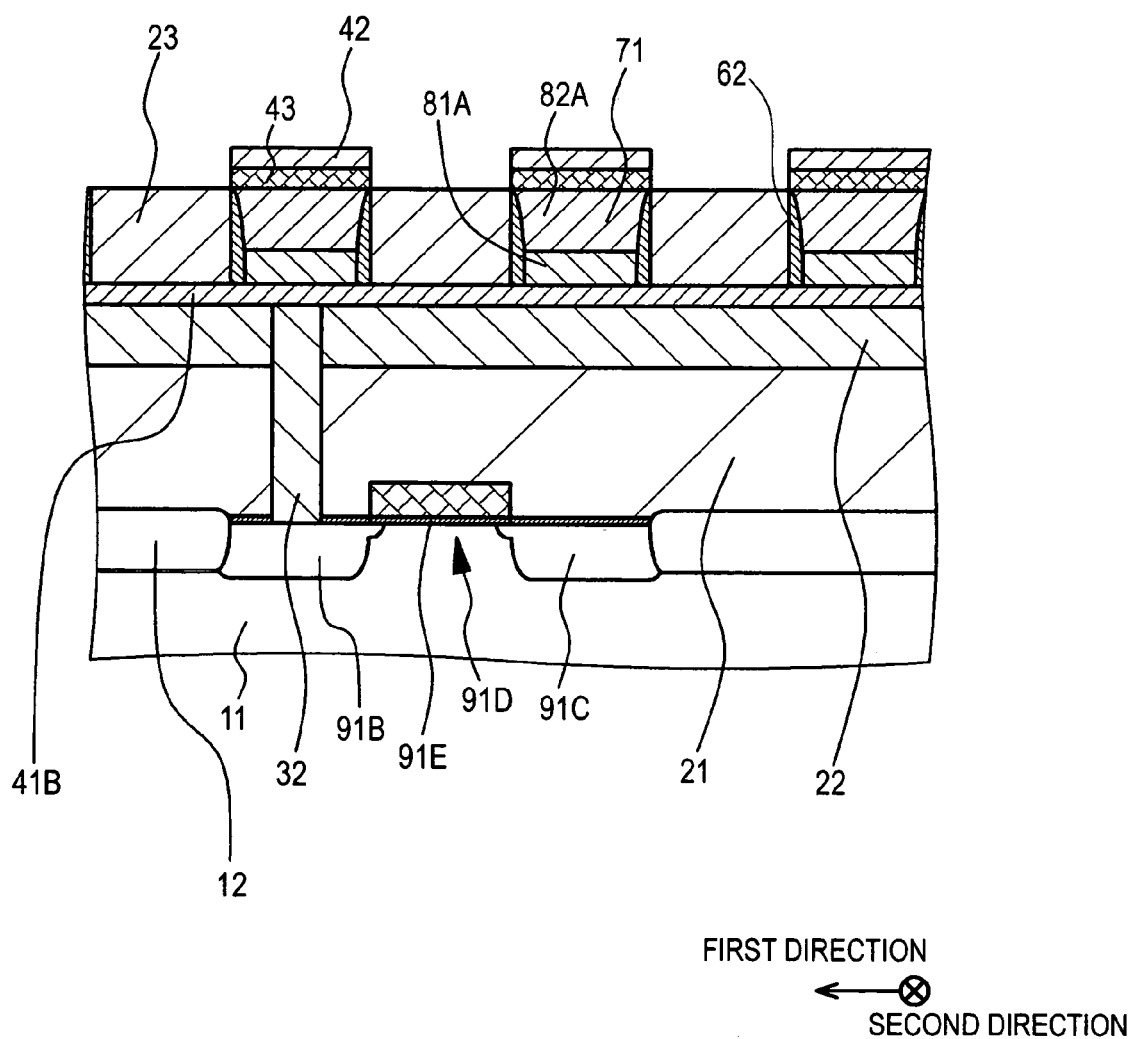
FIG. 7 is a schematic partial sectional view, different from FIG. 6, of the cross-point semiconductor memory device according to the Embodiment 1 along the first direction.
Figure 10A:
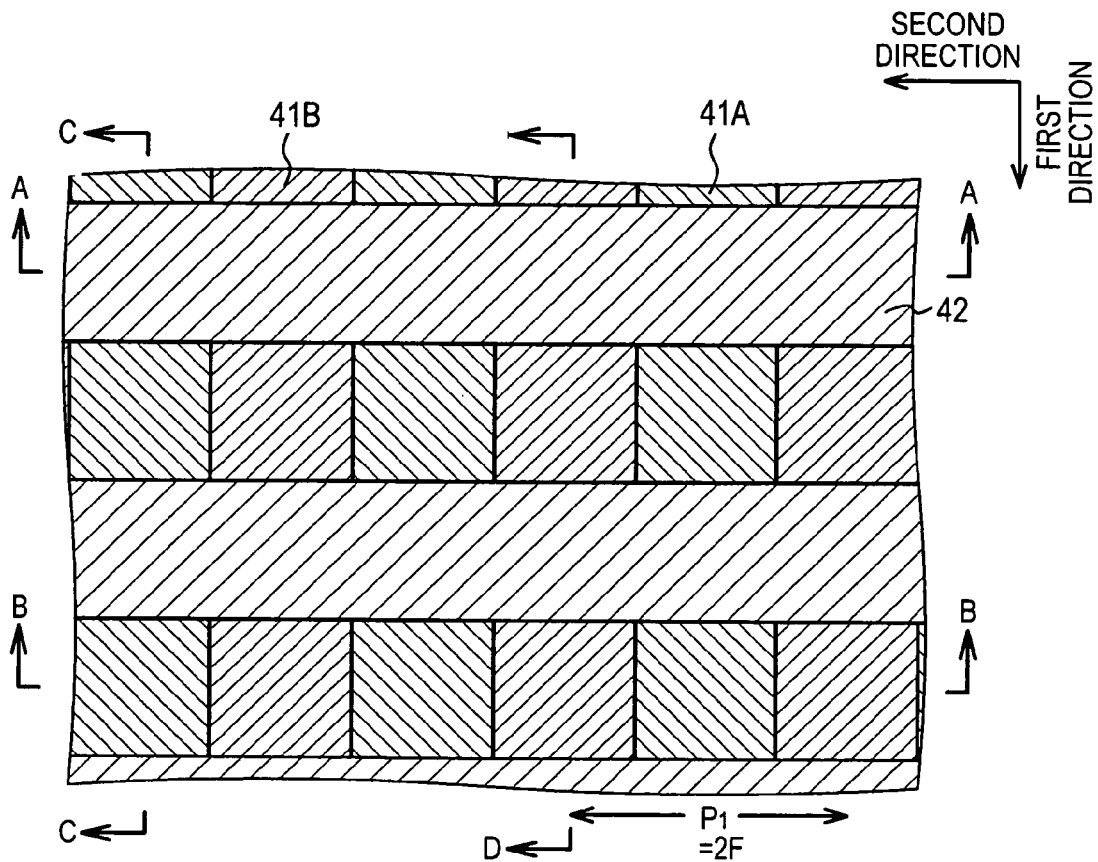
FIGS. 10A and 10B are diagrams schematically showing the arrangement states of first wirings and second wirings in the cross-point semiconductor memory device according to the Embodiment 1, respectively, and schematic views when the cross-point semiconductor memory device according to the Embodiment 1 is viewed from above.
Figure 10B:
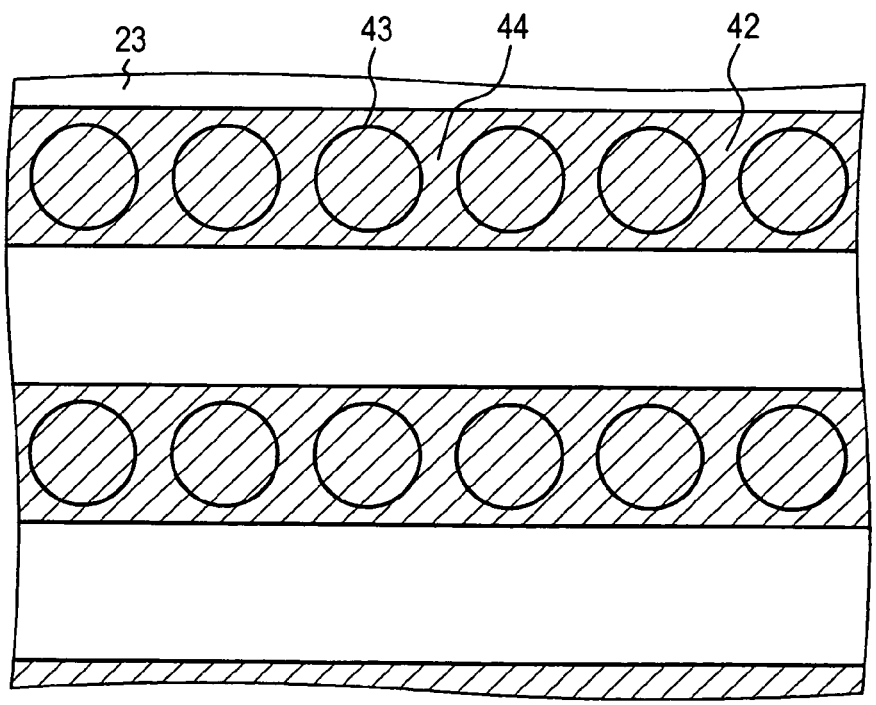
Figure 11:
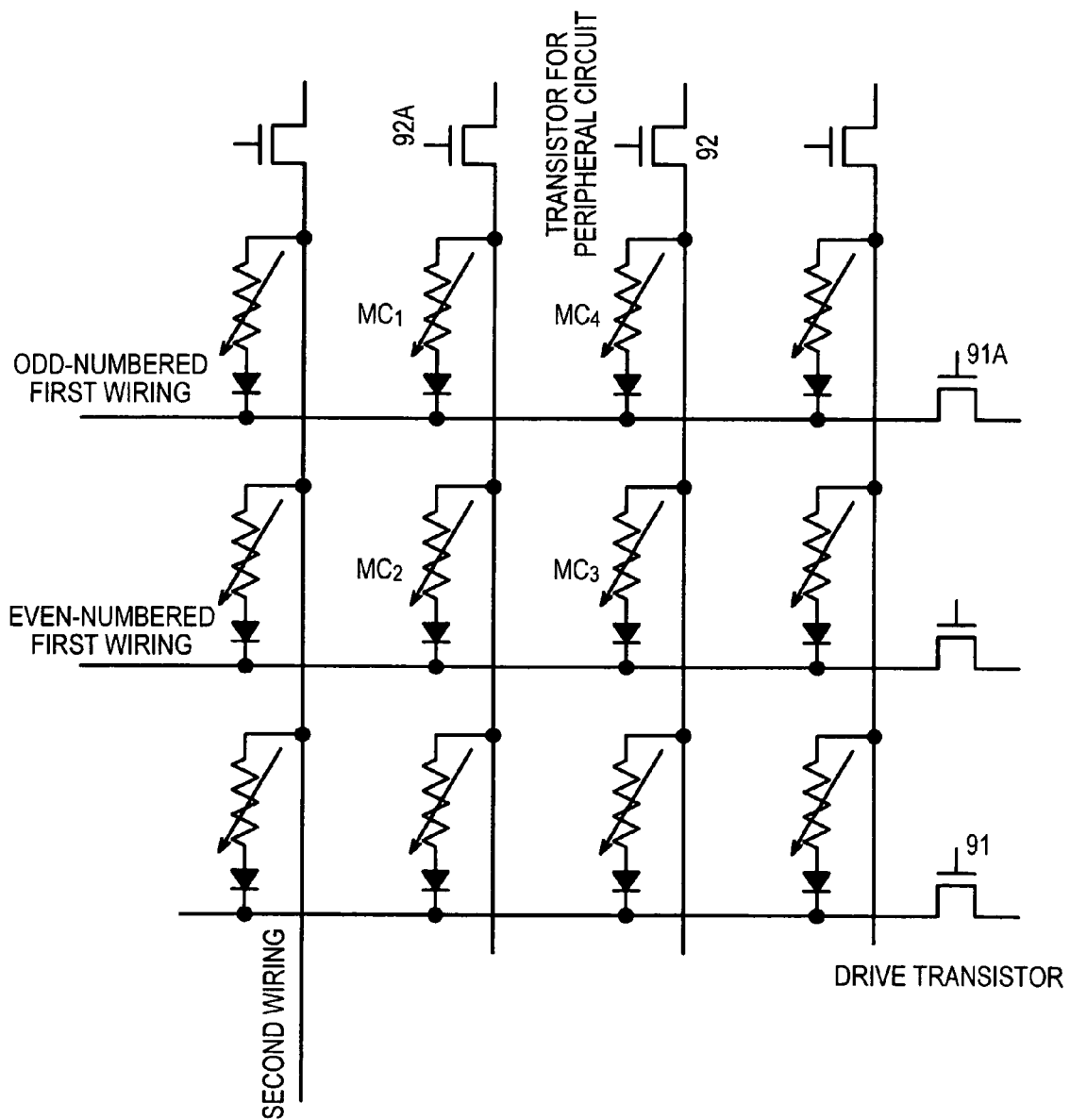
FIG. 11 is an equivalent circuit diagram of the cross-point semiconductor memory device according to the embodiment of the invention.
Figure 12:
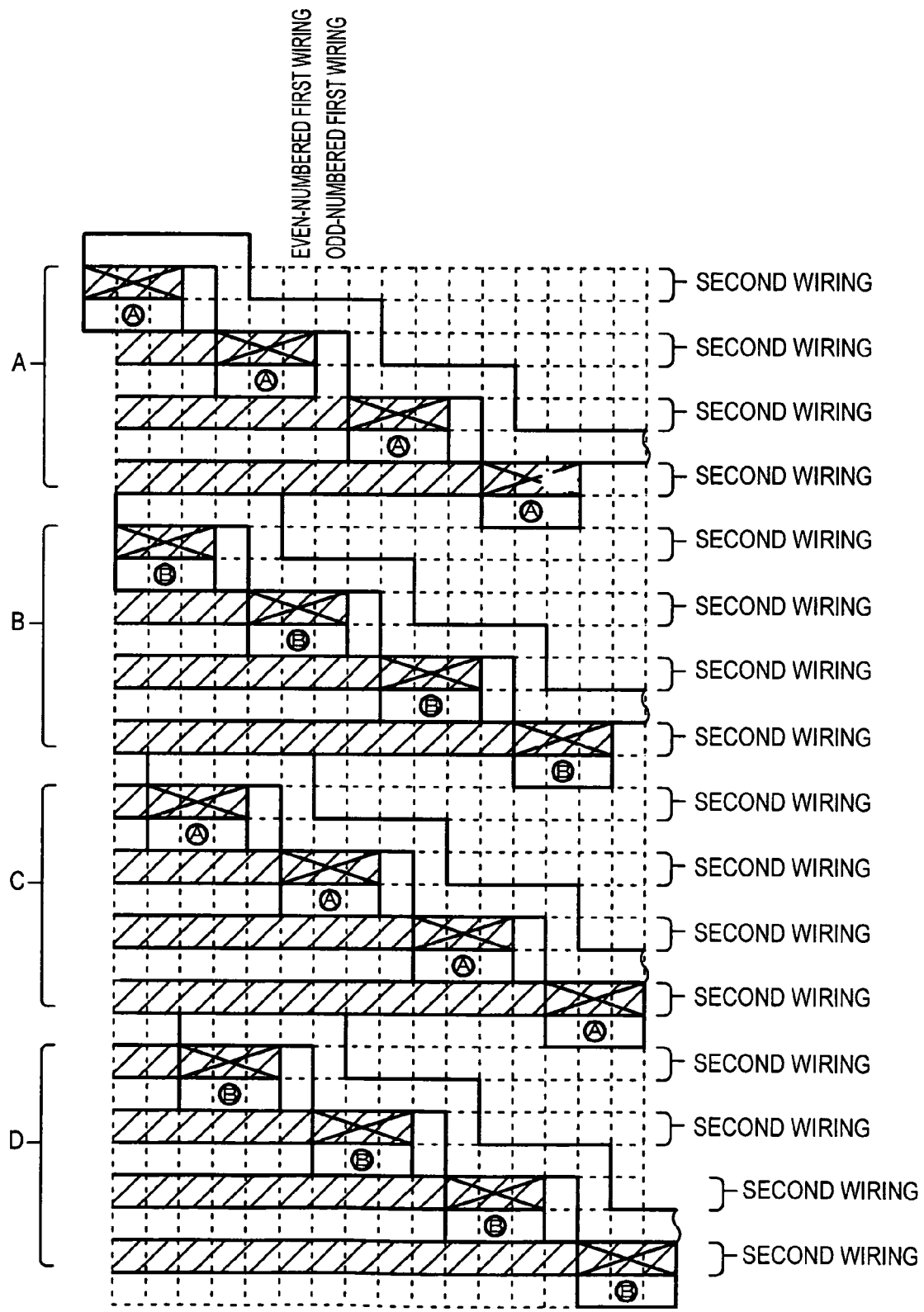
FIG. 12 is a schematic view illustrating the arrangement state of drive transistors in the cross-point semiconductor memory device according to the embodiment of the invention.

Embodiment 1 relates to the cross-point semiconductor memory device and the method of manufacturing the same of an embodiment of the invention, and in particular, to the cross-point semiconductor memory device according to the first embodiment. FIGS. 4 and 5 are schematic partial sectional views of a cross-point semiconductor memory device according to the Embodiment 1 along a second direction. FIGS. 6 and 7 are schematic partial sectional views of the cross-point semiconductor memory device according to the Embodiment 1 along the first direction. FIG. 10A schematically shows the arrangement states of odd-numbered first wirings, even-numbered first wirings, and second wirings. FIG. 10B is a schematic view when the cross-point semiconductor memory device of the Embodiment 1 is viewed from above. FIG. 11 is an equivalent circuit diagram of the cross-point semiconductor memory device of the Embodiment 1. FIG. 12 is a schematic view illustrating the arrangement state of drive transistors in the cross-point semiconductor memory device of the Embodiment 1. FIG. 4 is a schematic partial sectional view taken along the line A-A of FIG. 10A. FIG. 5 is a schematic partial sectional view taken along the line B-B of FIG. 10A. FIG. 6 is a schematic partial sectional view taken along the line C-C of FIG. 10A. FIG. 7 is a schematic partial sectional view taken along the line D-D of FIG. 10A. In FIGS. 10A and 10B, odd-numbered first wirings, even-numbered first wirings, and second wirings are shaded explicitly. In FIG. 10B, in order to show memory parts explicitly, the outer edges of places corresponding to the memory parts are circled. FIG. 12 shows 8 odd-numbered first wirings, 8 even-numbered first wirings, and 16 second wirings (that is, 16×16 memory cells). A gate electrode 91A (described below) extending in the second direction is shaded. In the cross-point semiconductor memory device, an area where a plurality of memory cells are provided may be called a memory cell array area.

The cross-point semiconductor memory device of the Embodiment 1 includes (A) a plurality of first wirings (so-called word lines) 41A and 41B extending in a first direction, (B) a plurality of second wirings (so-called bit lines) 42 positioned on a layer different from the first wirings 41A and 41B (specifically, a different layer in a vertical direction of the section of an element or a memory part) to extend in a second direction different from the first direction, and (C) memory parts 43 provided in overlap areas of the first wirings 41A and 41B and the second wirings 42. The odd-numbered first wirings 41A and the even-numbered first wirings 41B are arranged on different insulating interlayers 21 and 22 in an up-down direction.

One memory cell (memory element) includes one first wiring 41A or 41B, one second wiring 42, and a memory part 43 sandwiched between one first wiring 41A or 41B and one second wiring 42.

In the cross-point semiconductor memory device of the Embodiment 1 or a cross-point semiconductor memory device obtained by a method of manufacturing a cross-point semiconductor memory device of the Embodiment 1 described below (hereinafter, collectively referred to as "the cross-point semiconductor memory device of the Embodiment 1 and the like"), the arrangement state of the odd-numbered first wirings 41A and the arrangement state of the even-numbered first wirings 41B are out of alignment by half of an arrangement pitch ($P_1$) of the odd-numbered and even-numbered first wirings, respectively. The arrangement pitch $P_1$ of the odd-numbered or even-numbered first wirings 41A or 41B is two times larger than the minimum process dimension F. That is, the odd-numbered first wirings 41A arranged in a line-and-stripe shape have a width equal to the minimum process dimension F, a distance between the first wiring 41A and the first wiring 41A is equal to the minimum process dimension F. The even-numbered first wirings 41B arranged in a line-and-stripe shape have a width equal to the minimum process dimension F, and a distance between the first wiring 41B and the first wiring 41B is equal to the minimum process dimension F. Further, in the cross-point semiconductor memory device of the Embodiment 1 and the like, projection images of the odd-numbered first wirings 41A and projection images of the even-numbered first wirings 41B do not overlap each other and have no gap (see FIG. 10A). The second wirings 42 arranged in a line-and-stripe shape have a width equal to the minimum process dimension F, and a distance between the second wiring 42 and the second wiring 42 is equal to the minimum process dimension F. The projection images of the first wirings 41A and 41B and the projection images of the second wirings 42 are orthogonal to each other.

In the Embodiment 1, the first wirings 41A and 41B are positioned below the second wirings 42. Adjacent memory parts 43 in the second direction are connected to each other by a memory extension part 44. The second wirings 42 and a memory layer 45 having the memory parts 43 and the memory extension parts 44 have a laminated structure. The memory layer 45 is a lower layer, and the second wirings 42 are an upper layer.

The cross-point semiconductor memory device of the Embodiment 1 and the like further include drive transistors 91 connected to the first wirings 41A and 41B and formed on a semiconductor substrate 11, and transistors 92 for a peripheral circuit connected to the second wirings 42 and formed on the semiconductor substrate 11. The transistors 92 for a peripheral circuit are provided in a peripheral circuit part (not shown). The odd-numbered first wirings 41A are formed on a first insulating interlayer 21 covering the drive transistors 91. The even-numbered first wirings 41B are formed on a second insulating interlayer 22 covering the first insulating interlayer 21 and the odd-numbered first wirings 41A. The memory layer 45 is formed on a third insulating interlayer 23 covering the second insulating interlayer 22 and the even-numbered first wirings 41B. The odd-numbered first wirings 41A and the memory parts 43 are connected to each other through first connection holes 71 provided in the second insulating interlayer 22 and the third insulating interlayer 23. The even-numbered first wirings 41B and the memory parts 43 are connected to each other through second connection holes 72 provided in the third insulating interlayer 23. The first connection holes 71 and the second connection holes 72 function as diodes. Specifically, the first connection holes and the second connection holes 72 each have a semiconductor layer area containing an impurity of a first conduction type (specifically, a semiconductor layer area 82A containing a p-type impurity) and a semiconductor layer area containing an impurity of a second conduction type different from the first conduction type (specifically, a semiconductor layer area 81A containing an n-type impurity). When the first connection holes 71 and the second connection holes 72 do not function as diodes, when a drive transistor 91A and a drive transistor 92A for a peripheral circuit in FIG. 11 are turned on to select a memory cell $MC_1$, for example, it may be impossible to prevent a current from flowing through paths of memory cells $MC_2$, $MC_3$, and $MC_4$.

Each of the drive transistors 91 is a field effect transistor (FET), the width of a channel forming area 91D of the drive transistor 91 is 1.5 times (=3F) larger than the arrangement pitch $P_1$ of the odd-numbered or even-numbered first wirings 41A and 41B, and a width direction of the channel forming area 91D of the drive transistor 91 is parallel to the second direction. One source/drain area 91B of the drive transistors 91 is connected to the odd-numbered first wirings 41A through first connection parts 31 provided in the first insulating interlayer 21 or connected to the even-numbered first wirings 41B through second connection parts 32 provided in the first insulating interlayer 21 and the second insulating interlayer 22. In the Embodiment 1, the other source/drain area 91C of the drive transistors 91 is grounded. Though not shown, connection to the ground line is made in the periphery of the memory cell array area. Reference numeral 91E represents a gate insulating film. As described above, if the width of the channel forming area 91D is set to be 1.5 times larger than the arrangement pitch $P_1$, an increase in drive ability of the drive transistors can be achieved. Further, the drive transistors are provided below the memory cells, that is, the drive transistors are provided in the memory cell array area, so the occupying area of the peripheral circuit part can be reduced. In order to enable such an arrangement of the drive transistors 91, as shown in FIG. 12, the array is divided into a plurality of groups A, B, C, and D, the drive transistors 91 are arranged for every arrangement pitch 4F in the respective groups, and these groups are repeated four times as the whole of the array. Thus, the drive transistors 91 can be arranged for all the first wirings.

In FIG. 12, the occupying area of the channel forming area 91D is represented by "x", the first connection part 31 is represented by a circled alphabet letter "A", the second connection part 32 is represented by a circled alphabet letter "B". The connection parts are provided to be out of alignment for every four first wirings and one second wiring. That is, four drive transistors 91 are provided for (16 first wirings)×(4 second wirings).

In the cross-point semiconductor memory device of the Embodiment 1 and the like, a memory cell is composed of a phase-change memory (PRAM). That is, in the Embodiment 1, a phase-change material forming a memory part whose electrical resistance varies between an amorphous state and a crystalline state by several digits is used for an operation as a memory. Specifically, if a pulsed large current flows in the memory part for a short time (for example, 200 μA and 20 nanoseconds) and then the memory part is rapidly cooled, the phase-change material forming the memory part is put in the amorphous state and shows high resistance. Meanwhile, if a pulsed small current flows in the memory part for a relatively long time (for example, 100 μA and 100 nanoseconds) and then the memory part is rapidly cooled, the phase-change material forming the memory part is put in the crystalline state and shows low resistance. Although the memory part 43 or the memory layer 45 is made of a chalcogenide-based material, the invention is not limited thereto. For example, the memory part 43 or the memory layer 45 may be made of a material having the CMR effect.

For example, when data stored in the memory cell $MC_1$ (specifically, a resistance value of the memory part forming the memory cell $MC_1$) is read, the transistor 92A for a peripheral circuit connected to the memory cell $MC_1$ is turned on, a predetermined voltage $V_b$ is applied to the second wiring 42, and other transistors 92 for a peripheral circuit are turned off. Further, the drive transistor 91A connected to the memory cell $MC_1$ is turned on, and other drive transistors are turned off. In this way, a current flows from the drive transistor 92 for a peripheral circuit to the drive transistor 91. As a result, a current flows through the drive transistor 92A for a peripheral circuit, the memory part 43 forming the memory cell $MC_1$, the diode, and the drive transistor 91A, so whether the resistance value of the memory part 43 is low resistance or high resistance can be determined and stored information can be read. An operation to write information in the memory cell $MC_1$ may be substantially performed in the same manner with the value of a current flowing and a pulse value appropriately selected.

Though not shown, two or more drive transistors 91 may be connected to one first wiring 41A or 41B, and two or more transistors 92 for a peripheral circuit may be connected to one second wiring 42, such that the potentials on the first wiring 41A or 41B and the second wiring 42 rapidly become a ground potential.

A method of manufacturing a cross-point semiconductor memory device of the Embodiment 1 will be described with reference to FIGS. 1A to 1C, 2A to 2C, 3A to 3C, and 4 to 7, which are schematic partial sectional views of the first insulating interlayer and the like, and FIGS. 8A and 8B, 9A and 9B, and 10A and 10B, which schematically show the arrangement of various wirings or openings. In FIGS. 1A to 1C, 2A to 2C, and 3A to 3C, or FIGS. 13A to 13C and 14A and 14B described below, the first connection parts 31 and the second connection parts 32 are not actually positioned within the same section as the second wirings or the like, but for convenience, they are shown as being positioned within the same section.

In a cross-point semiconductor memory device obtained by the method of manufacturing a cross-point semiconductor memory device of the Embodiment 1, the first wirings 41A and 41B are positioned below the second wirings 42, and the arrangement state of the odd-numbered first wirings 41A and the arrangement state of the even-numbered first wirings 41B are out of alignment by half of the arrangement pitch ($P_1$) of the odd-numbered and even-numbered first wirings, respectively. Adjacent memory parts 43 in the second direction are connected to each other by the memory extension part 44, and the second wirings 42 are formed on the memory parts 43 (and above the memory part 43).

[Step-100]

First, transistors including the drive transistors (FETs) 91 and the transistors (FETs) 92 for a peripheral circuit for forming a peripheral circuit are formed on the semiconductor substrate 11, for example, a silicon semiconductor substrate by an existing method. As shown in the schematic views of the FIGS. 4 to 7 and 12, each of the drive transistors 91 has a gate electrode 91A and source/drain areas 91B and 91C. Reference numeral 12 represents an element isolation area.

[Step-110]

Figure 8A:
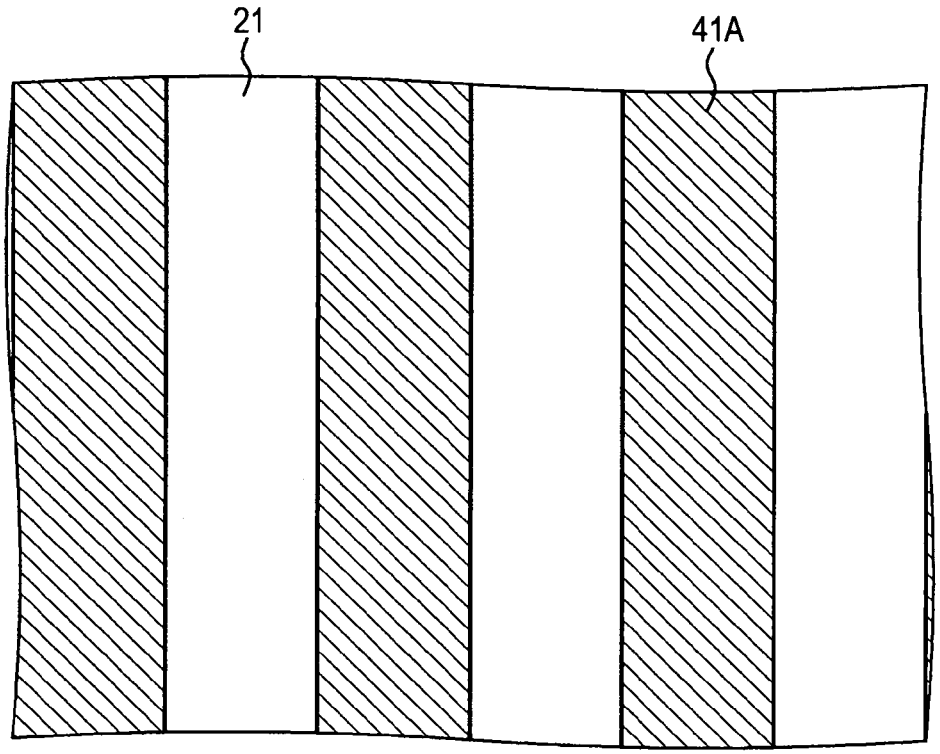
FIGS. 8A and 8B are diagrams schematically showing the arrangement states of odd-numbered first wirings and even-numbered first wirings in the cross-point semiconductor memory device according to the Embodiment 1, respectively.

Thereafter, the first insulating interlayer 21 made of $SiO_2$ is formed on the entire surface by the CVD method, and the first insulating interlayer 21 is planarized by the CMP (Chemical Mechanical Polishing) method or the like. Next, the odd-numbered first wirings 41A electrically connected to the odd-numbered drive transistors 91 are formed on the first insulating interlayer 21. Specifically, for example, openings are formed in the portions of the first insulating interlayer 21 above one source/drain area 91B of the odd-numbered drive transistors 91 by photolithography and dry etching, and the openings are buried with a conductive material to form the first connection parts 31. Next, a cohesive layer (not shown) made of Ti or TiN and a conductive material layer made of tungsten (W) are formed on the first insulating interlayer 21 including the first connection parts 31 by sputtering and patterned by photolithography and dry etching to form the odd-numbered first wirings 41A extending in the first direction (a vertical direction in the drawing). Thus, the structure shown in FIGS. 1A and 8A can be obtained. In FIG. 8A, in order to show the odd-numbered first wirings 41A explicitly, the odd-numbered first wirings 41A are shaded.

[Step-120]

Figure 8B:
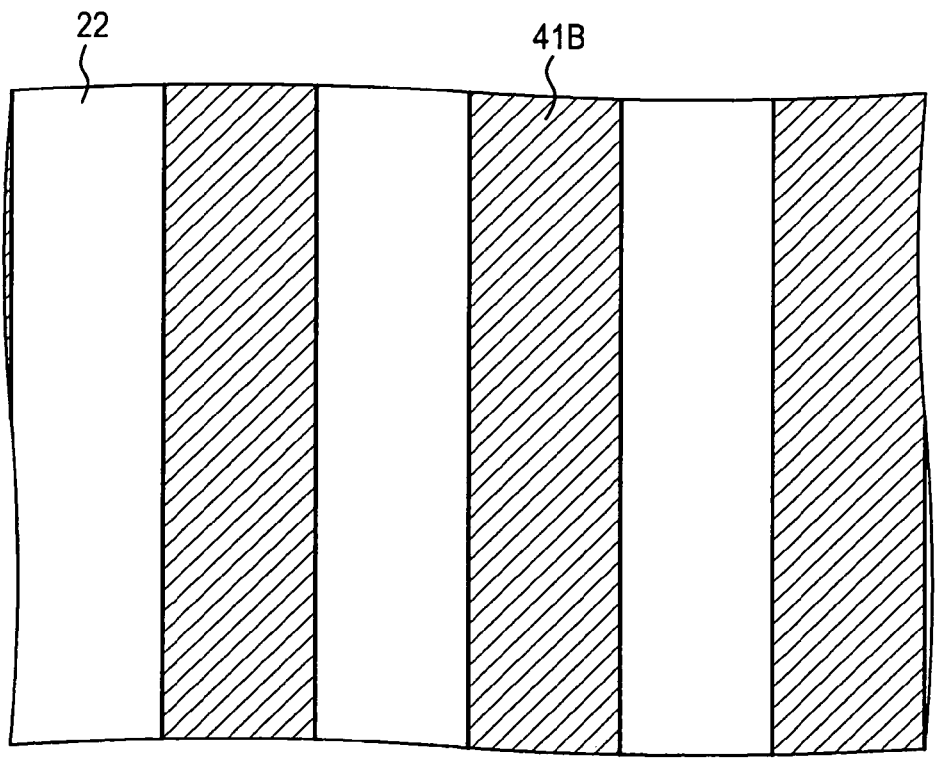
Figure 9A:
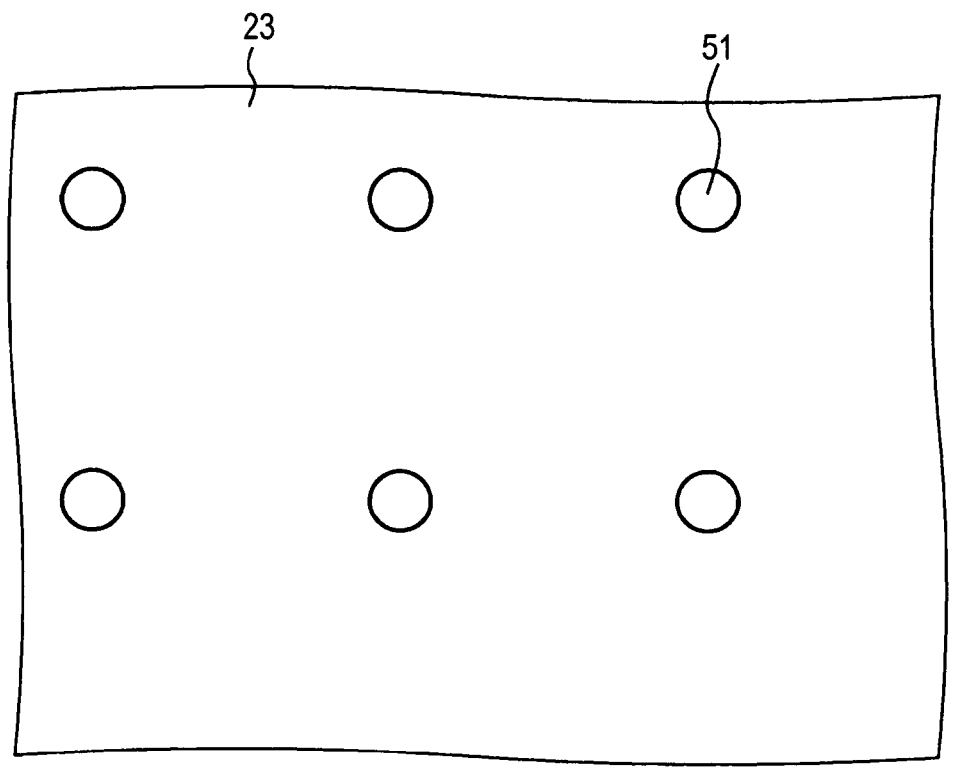
FIGS. 9A and 9B are diagrams schematically showing the arrangement states of first openings and second openings in the cross-point semiconductor memory device according to the Embodiment 1, respectively.
Figure 9B:
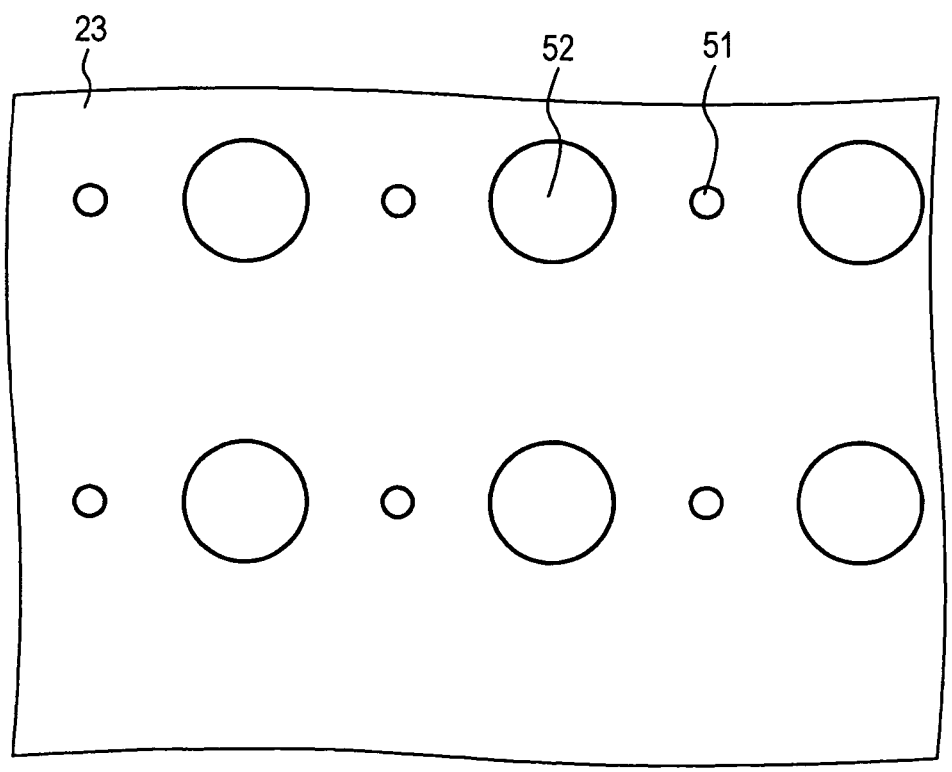

Thereafter, the second insulating interlayer 22 made of $SiO_2$ is formed on the entire surface by the CVD method, and the even-numbered first wirings 41B electrically connected to the even-numbered drive transistors 91 are formed on the second insulating interlayer 22. Specifically, for example, openings are formed in the portions of the first insulating interlayer 21 and the second insulating interlayer 22 above one source/drain area 91B of the even-numbered drive transistors 91 by photolithography and dry etching, and the openings are buried with a conductive material to form the second connection parts 32. Next, a cohesive layer (not shown) made of Ti or TiN and a conductive material layer made of tungsten (W) are formed on the second insulating interlayer 22 including the second connection parts 32 by sputtering and patterned by photolithography and dry etching to form the even-numbered first wirings 41B extending in the first direction. Thus, the structure shown in FIGS. 1B and 8B can be obtained. In FIG. 8B, in order to show the even-numbered first wirings 41B explicitly, the even-numbered first wirings 41B are shaded.

[Step-130]

Figure 1C:
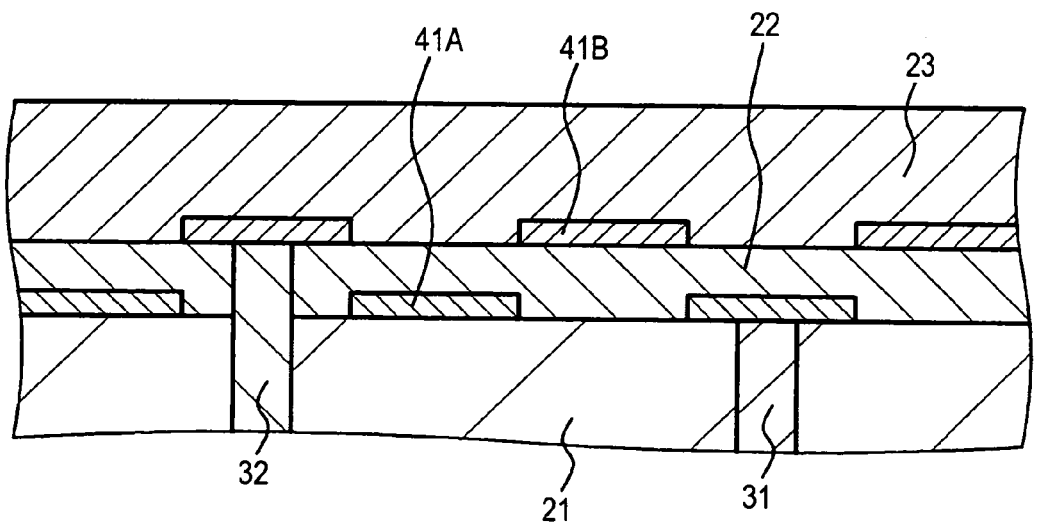
Figure 2A:
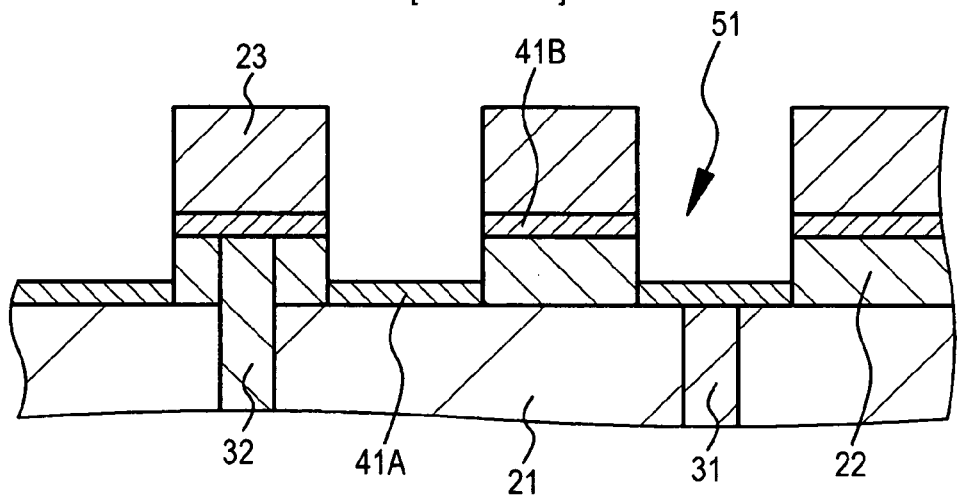
FIGS. 2A to 2C are schematic partial sectional views of the first insulating interlayer and the like, subsequent to FIG. 1C, illustrating the method of manufacturing the cross-point semiconductor memory device according to the Embodiment 1.
Figure 2B:
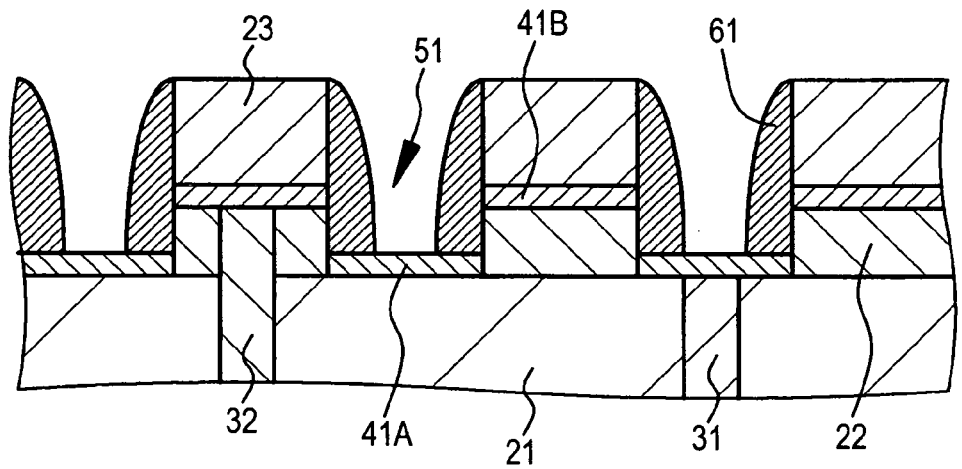
Figure 2C:
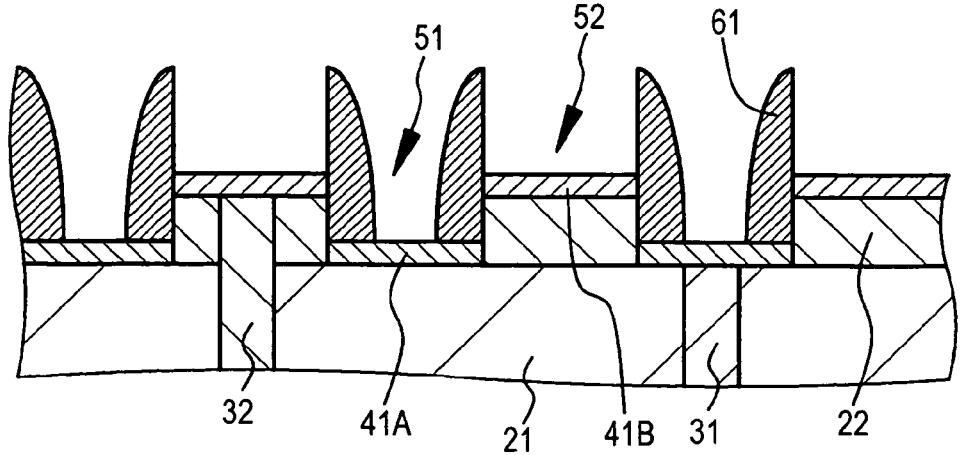
Figure 3A:
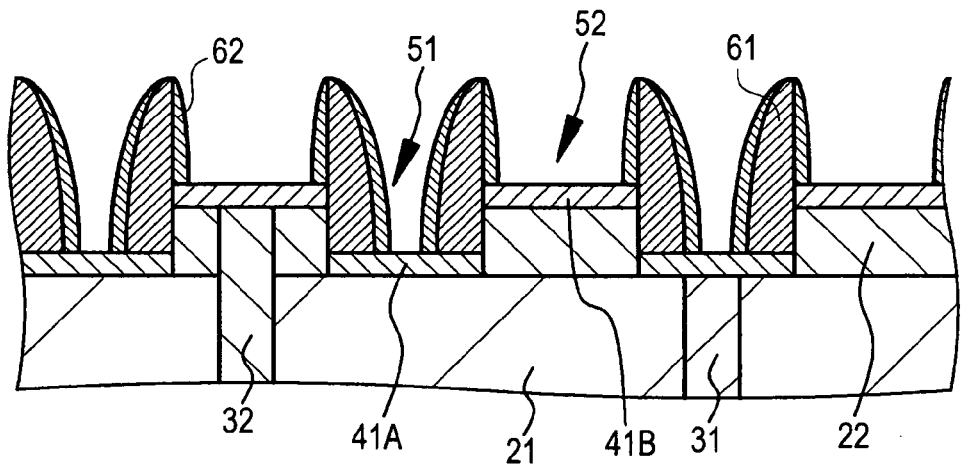
FIGS. 3A to 3C are schematic partial sectional views of the first insulating interlayer and the like, subsequent to FIG. 2C, illustrating the method of manufacturing the cross-point semiconductor memory device according to the Embodiment 1.
Figure 3B:
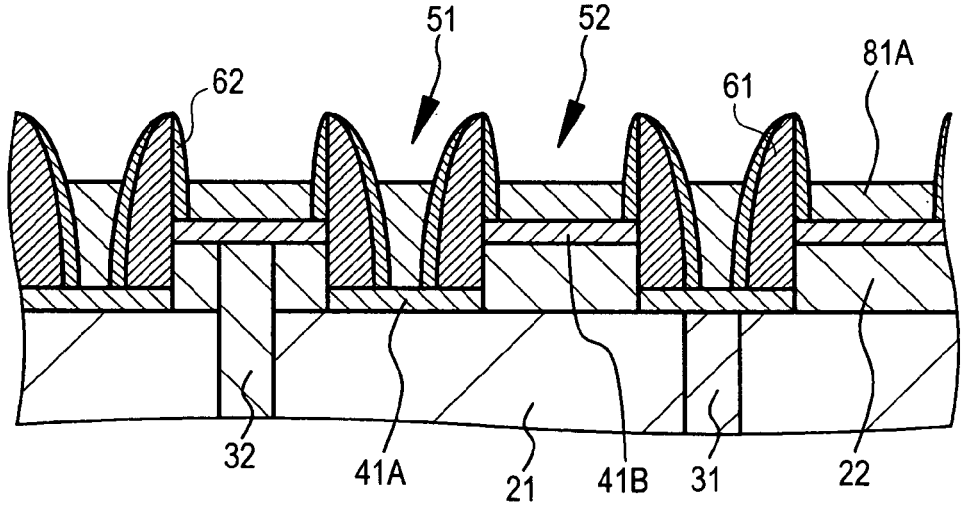
Figure 3C:
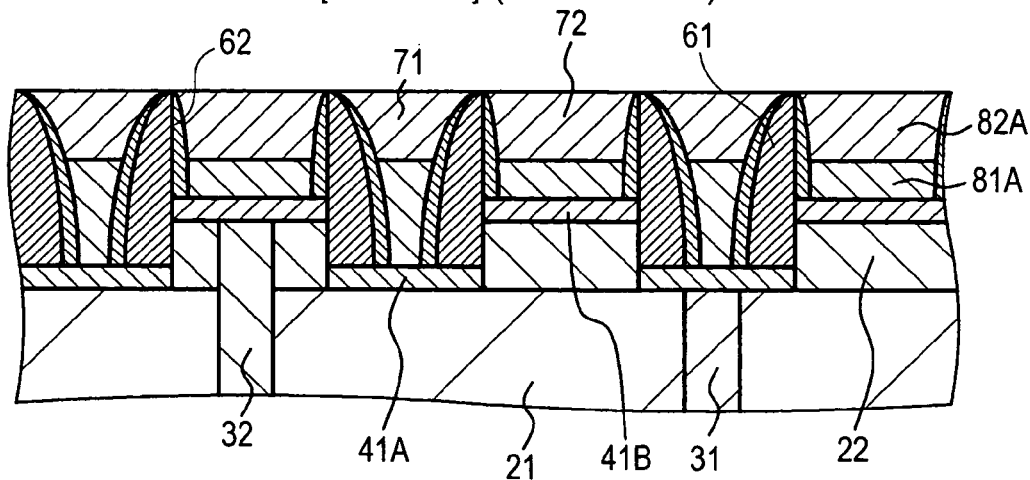

Thereafter, the third insulating interlayer 23 made of $SiO_2$ is formed on the entire surface by the CVD method (see FIG. 1C).

[Step-140]

Next, first openings 51 are formed in the portions of the second insulating interlayer 22 and the third insulating interlayer 23 above the odd-numbered first wirings 41A, and first sidewalls 61 are formed at the sidewall parts of the first openings 51 to reduce the diameter of the first openings 51. Further, second openings 52 are formed in the portions of the third insulating interlayer 23 above the even-numbered first wirings 41B, and second sidewalls 62 are formed at the sidewall parts of the second openings 52 to reduce the diameter of the second openings 52. Then, the first openings 51 are filled with a conductive material to form the first connection holes 71, and the second openings 52 are filled with a conductive material to form the second connection holes 72. That is, [Step-140] includes the following six steps:

(e-1) forming the first openings 51 in the second insulating interlayer 22 and the third insulating interlayer 23 above the odd-numbered first wirings 41A;

(e-2) forming the first sidewalls 61 at the sidewall parts of the first openings 51 to reduce the diameter of the first openings 51;

(e-3) forming the second openings 52 in the third insulating interlayer 23 above the even-numbered first wirings 41B;

(e-4) forming the second sidewalls 62 at the sidewall parts of the second openings 52 to reduce the diameter of the second openings 52;

(e-5) filling a conductive material in the first openings 51 to form the first connection holes 71; and (e-6) filling a conductive material in the second openings 52 to form the second connection holes 72.

In the Embodiment 1, these steps are executed in a sequence of (e-1)→(e-2)→(e-3)→(e-4)→(e-5) and (e-6).

[Step-140A]

That is, the first openings 51 are first formed in the portions of the second insulating interlayer 22 and the third insulating interlayer 23 above the odd-numbered first wirings 41A, and the first sidewalls 61 are formed at the sidewall parts of the first openings 51 to reduce the diameter of the first openings 51. Specifically, the first openings 51 are formed in the portions of the second insulating interlayer and the third insulating interlayer 23 above the odd-numbered first wirings 41A by photolithography and dry etching (see FIG. 2A). Thereafter, a sidewall layer made of SiN is formed on the entire surface including the first openings 51 by the CVD method and then etched back. Thus, the structure shown in FIGS. 2B and 9A can be obtained.

[Step-140B]

Thereafter, the second openings 52 are formed in the portions of the third insulating interlayer 23 above the even-numbered first wirings 41B, and the second sidewalls 62 are formed at the sidewall parts of the second openings 52 to reduce the diameter of the second openings 52. Specifically, the second openings 52 are formed in the portions of the third insulating interlayer 23 above the even-numbered first wirings 41B by photolithography and dry etching (see FIG. 2C). Thereafter, a sidewall layer made of SiN is formed on the entire surface including the first openings 51 and the second openings 52 by the CVD method and then etched back. Thus, the structure shown in FIGS. 3A and 9B can be obtained.

[Step-140C]

Next, the first openings 51 are filled with a conductive material to form the first connection holes 71, and the second openings 52 are filled with a conductive material to form the second connection holes 72. Specifically, a polysilicon layer containing an n-type impurity is formed on the entire surface by the CVD method and then etched back (see FIG. 3B). Thereafter, a polysilicon layer containing a p-type impurity is formed on the entire surface by the CVD method and then etched back (see FIG. 3C). Thus, a structure in which the first connection holes 71 and the second connection holes each have the semiconductor layer area 82A containing a p-type impurity and the semiconductor layer area 81A containing an n-type impurity can be obtained. An impurity is implanted into the polysilicon layer by an ion implantation method, such that the semiconductor layer area 82A containing a p-type impurity and the semiconductor layer area 81A containing an n-type impurity can be obtained.

[Step-150]

Thereafter, the memory parts 43 (specifically, the memory layer 45) and the second wirings 42 are formed on the third insulating interlayer 23 so as to seal the first connection holes 71 and the second connection holes 72. Specifically, the memory layer 45, a cohesive layer (not shown) made of Ti or TiN, and a conductive material layer made of tungsten (W) are sequentially formed on the third insulating interlayer 23 including the top surfaces of the first connection holes 71 and the second connection holes 72 by sputtering and then patterned by photolithography and dry etching. Thus, a laminated structure of the second wirings 42 and the memory layer 45 shown in FIGS. 4 to 7 and 10B can be obtained.

According to the cross-point semiconductor memory device of the Embodiment 1 or the method of manufacturing the same, the odd-numbered first wirings 41A and the even-numbered first wirings 41B are arranged on different insulating interlayers 21 and 22 in the up-down direction. Therefore, when the memory parts 43 are formed with a pitch of the minimum process dimension F defined by the design rule of the manufacturing process, the pitch $P_1$ of the odd-numbered first wirings 41A can be set to 2F, and the pitch $P_1$ of the even-numbered first wirings 41B can be set to 2F. That is, when the first wirings are viewed as a whole, the pitch of the first wirings can be set to F. As a result, the memory cells having the first wirings, the memory parts, and the second wirings can have a size of $2F^2$, and a high-density semiconductor memory device can be realized.

A diode provided in the connection holes 71 or 72 is connected in series to the memory part 43, such that the flow of an unnecessary current can be restricted. The diode is formed in the connection holes 71 or 72, such that the diode can be arranged without increasing the area of the memory cell. The cross-point semiconductor memory device of the Embodiment 1 uses a method similar to a method of forming a self-aligned contact which is relatively commonly used, so it can be easily manufactured. The drive transistor 91 is arranged over a plurality of memory cells in the memory cell array, so the drive transistor 91 having large drive ability can be arranged efficiently and the reduction in the sectional area of the entire cross-point semiconductor memory device can be realized. If the drive transistor 91 is used as a type of switch for grounding the first wiring 41A or 41B, the other source/drain area 91C of the drive transistor 91 can be set to the ground potential common to each of the drive transistors 91, and the wiring of the transistors in the memory cell area can be simplified significantly, which facilitates the layout.

Embodiment 2

Embodiment 2 is a modification of the cross-point semiconductor memory device of the Embodiment 1. In the Embodiment 1, [Step-140] is executed in the sequence of (e-1)→(e-2)→(e-3)→(e-4)→(e-5) and (e-6). Meanwhile, in the Embodiment 2, [Step-140] is executed in a sequence of (e-1)→(e-2)→(e-5)→(e-3)→(e-4)→(e-6).

A method of manufacturing a cross-point semiconductor memory device of the Embodiment 2 will be described with reference to FIGS. 13A to 13C and 14A and 14B, which are schematic partial sectional views of a first insulating interlayer and the like.

[Step-200]

First, similarly to [Step-100] of the Embodiment 1, the drive transistors (FETs) 91 and the transistors (FETs) 92 for a peripheral circuit are formed on the semiconductor substrate 11.

[Step-210]

Thereafter, similarly to [Step-110] of the Embodiment 1, the first insulating interlayer 21 made of $SiO_2$ is formed on the entire surface by the CVD method, and odd-numbered first wirings 41A electrically connected to the odd-numbered drive transistors 91 are formed on the first insulating interlayer 21. Next, similarly to [Step-120] of the Embodiment 1, the second insulating interlayer 22 made of $SiO_2$ is formed on the entire surface by the CVD method, and the even-numbered first wirings 41B electrically connected to the even-numbered drive transistors 91 are formed on the second insulating interlayer 22. Next, similarly to [Step-130] of the Embodiment 1, the third insulating interlayer 23 made of $SiO_2$ is formed on the entire surface by the CVD method.

[Step-220]

Figure 13A:
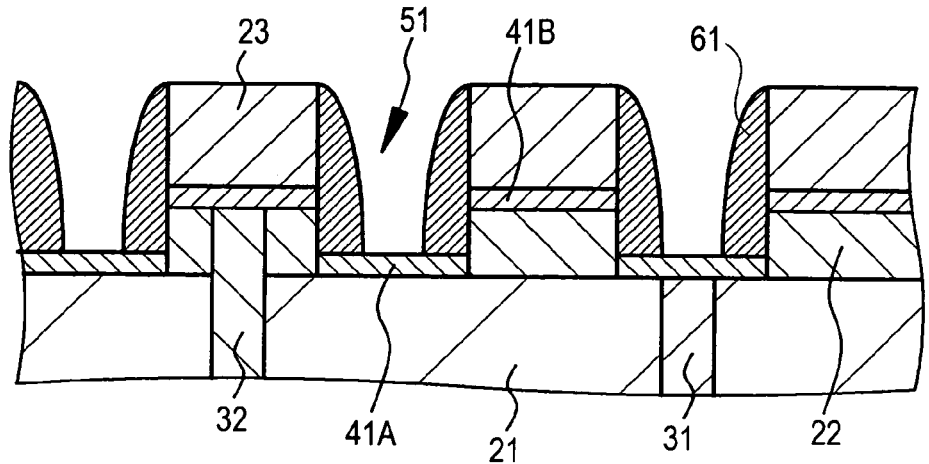
FIGS. 13A to 13C are schematic partial sectional views of a first insulating interlayer and the like illustrating a method of manufacturing a cross-point semiconductor memory device according to Embodiment 2.
Figure 13B:
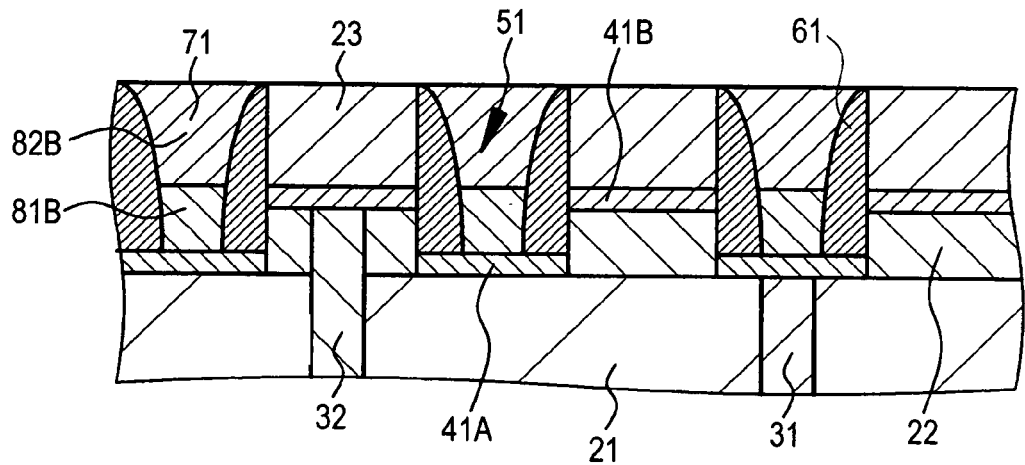
Figure 13C:
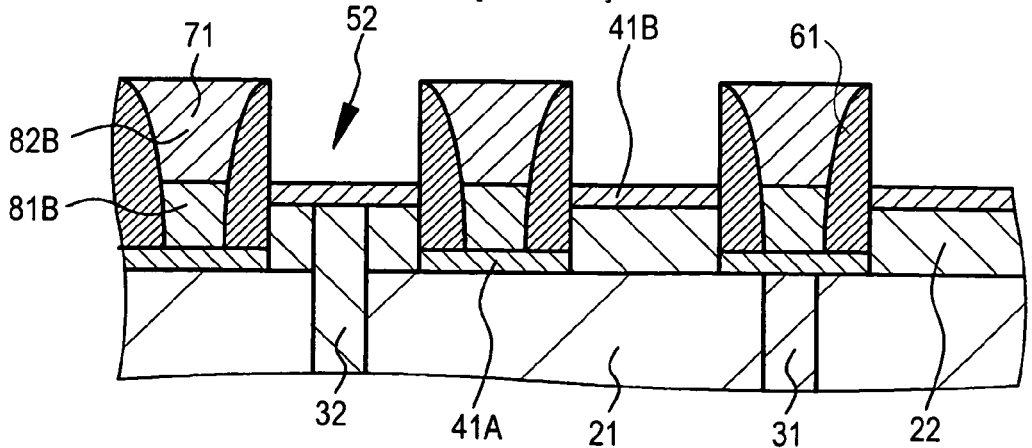
Figure 14A:
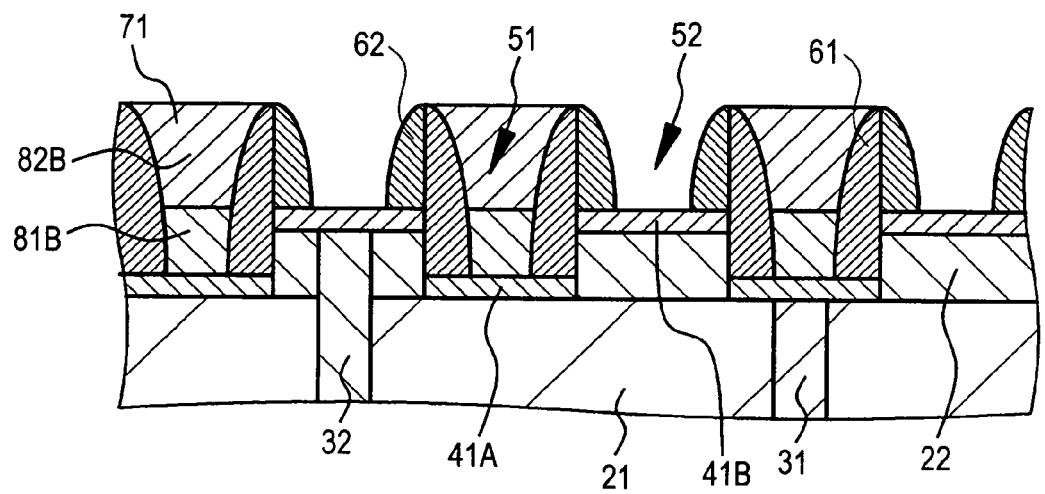
FIGS. 14A and 14B are schematic partial sectional views of the first insulating interlayer and the like, subsequent to FIG. 13C, illustrating the method of manufacturing the cross-point semiconductor memory device according to the Embodiment 2.
Figure 14B:
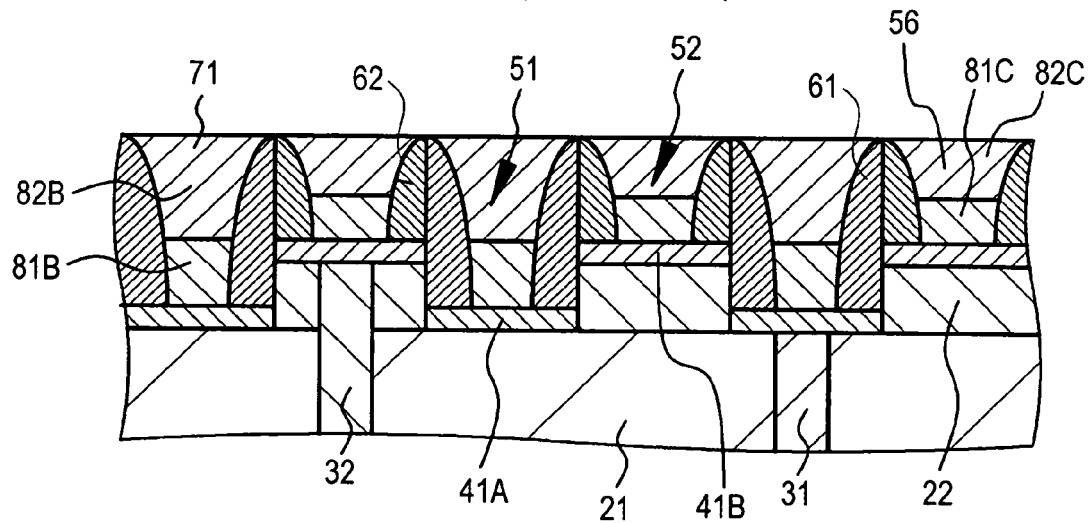

Next, similarly to [Step-140A] of the Embodiment 1, the first openings 51 are formed in the portions of the second insulating interlayer 22 and the third insulating interlayer above the odd-numbered first wirings 41A, and the first sidewalls 61 are formed at the sidewall parts of the first openings 51 to reduce the diameter of the first openings 51 (see FIG. 13A). Next, similarly to [Step-140C] of the Embodiment 1, the first openings 51 are filled with a conductive material (a semiconductor layer area 82B containing a p-type impurity and a semiconductor layer area 81B containing an n-type impurity). Thus, the structure shown in FIG. 13B can be obtained.

[Step-230]

Thereafter, the second openings 52 are formed in the portions of the third insulating interlayer 23 above the even-numbered first wirings 41B, and the second sidewalls 62 are formed at the sidewall parts of the second openings 52 to reduce the diameter of the second openings 52. Specifically, the second openings 52 are formed in the portions of the third insulating interlayer 23 above the even-numbered first wirings 41B by photolithography and dry etching (see FIG. 13C). Thereafter, a sidewall layer made of SiN is formed on the entire surface including the first openings 51 and the second openings 52 by the CVD method and then etched back. Thus, the structure shown in FIG. 14A can be obtained. Next, similarly to [Step-140C] of the Embodiment 1, the second openings 52 are filled with a conductive material (a semiconductor layer area 82C containing a p-type impurity and a semiconductor layer area 81C containing an n-type impurity). Thus, the structure shown in FIG. 14B can be obtained.

[Step-240]

Thereafter, similarly to [Step-150] of the Embodiment 1, the memory layer 45 and the second wirings 42 are formed on the third insulating interlayer 23 so as to seal the first connection holes 71 and the second connection holes 72.

Embodiment 3

Figure 15:
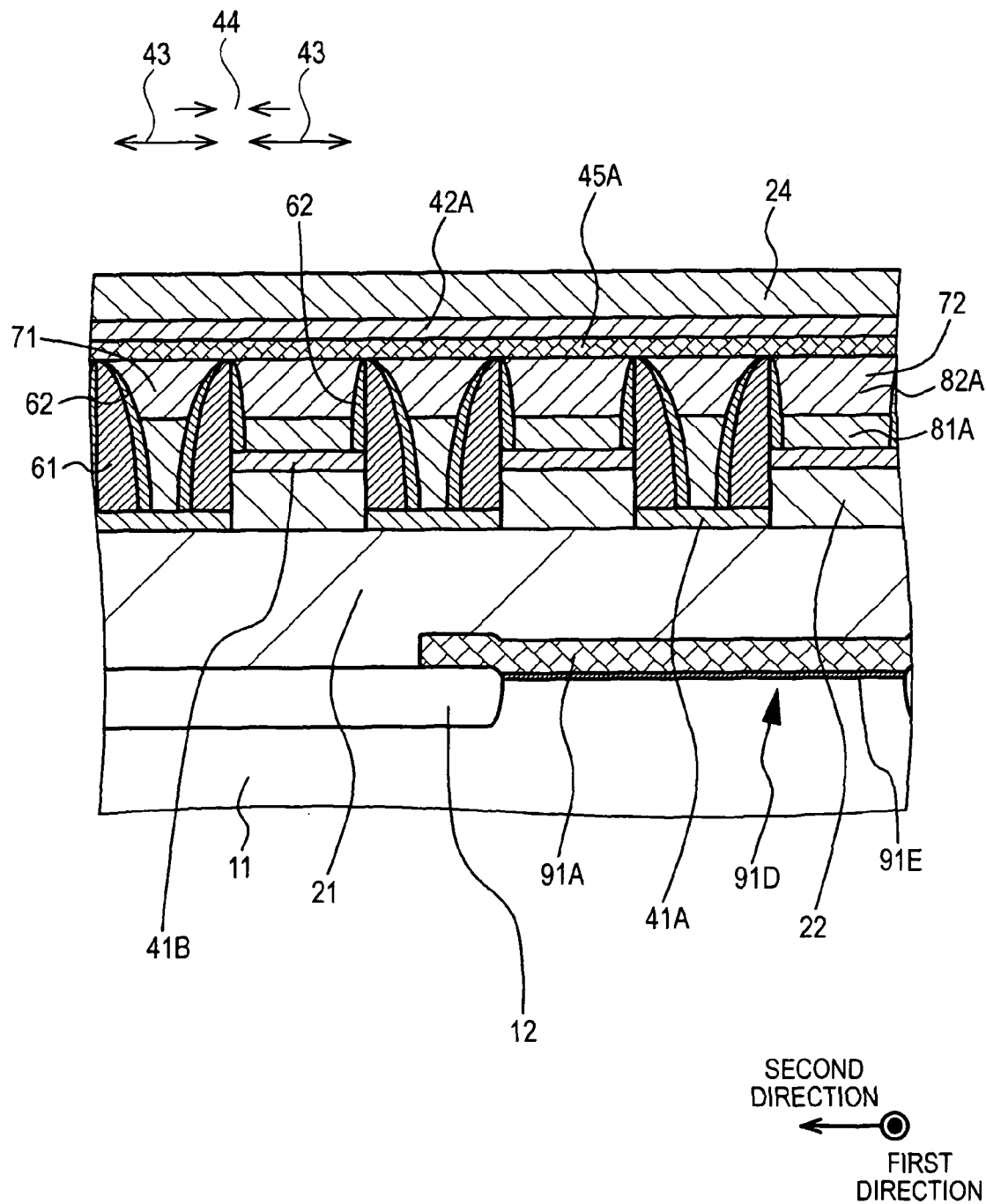
FIG. 15 is a schematic partial sectional view of a cross-point semiconductor memory device according to Embodiment 3 along the second direction.
Figure 16:
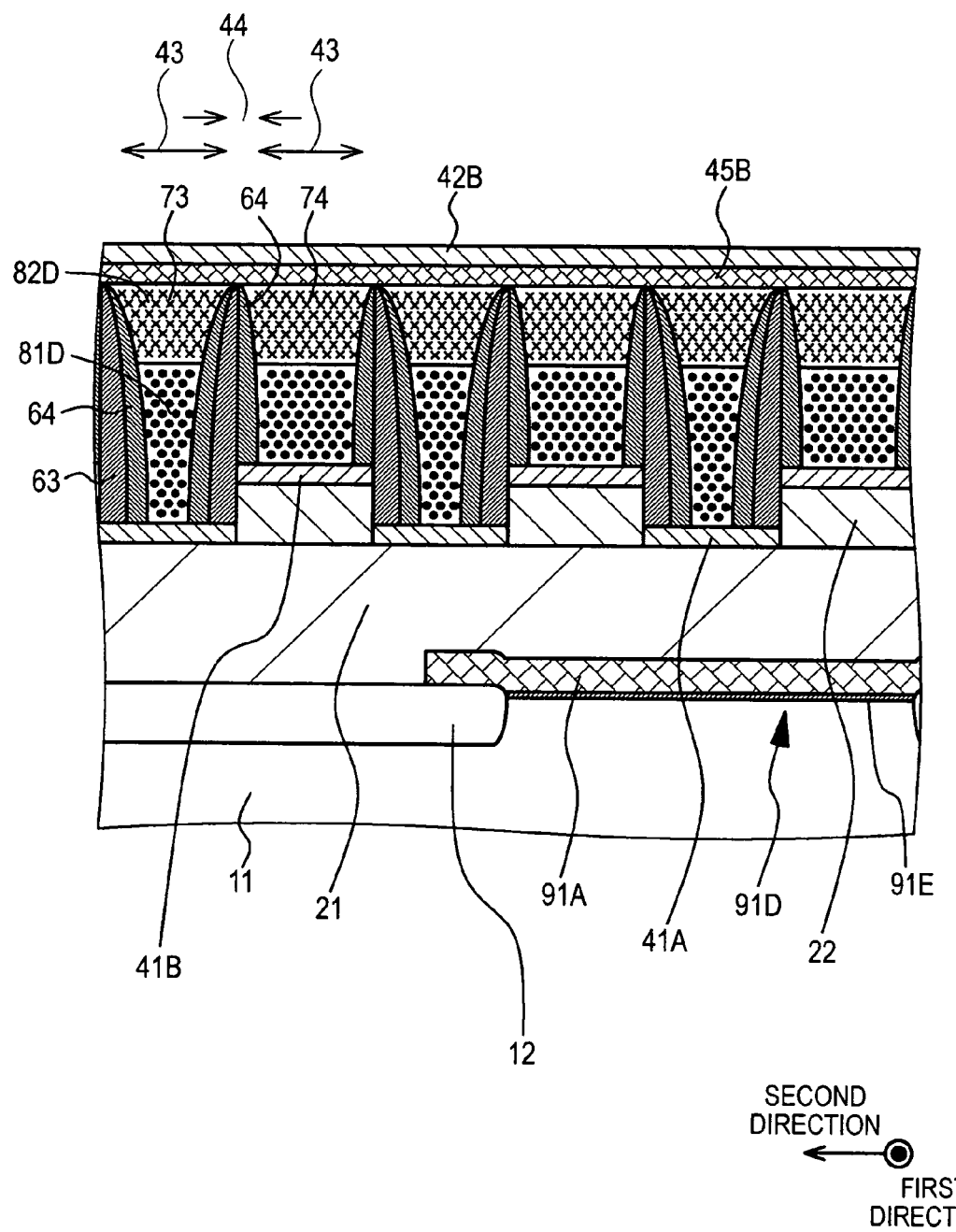
FIG. 16 is a schematic partial sectional view, different from FIG. 15, of the cross-point semiconductor memory device according to the Embodiment 3 along the second direction.
Figure 17:
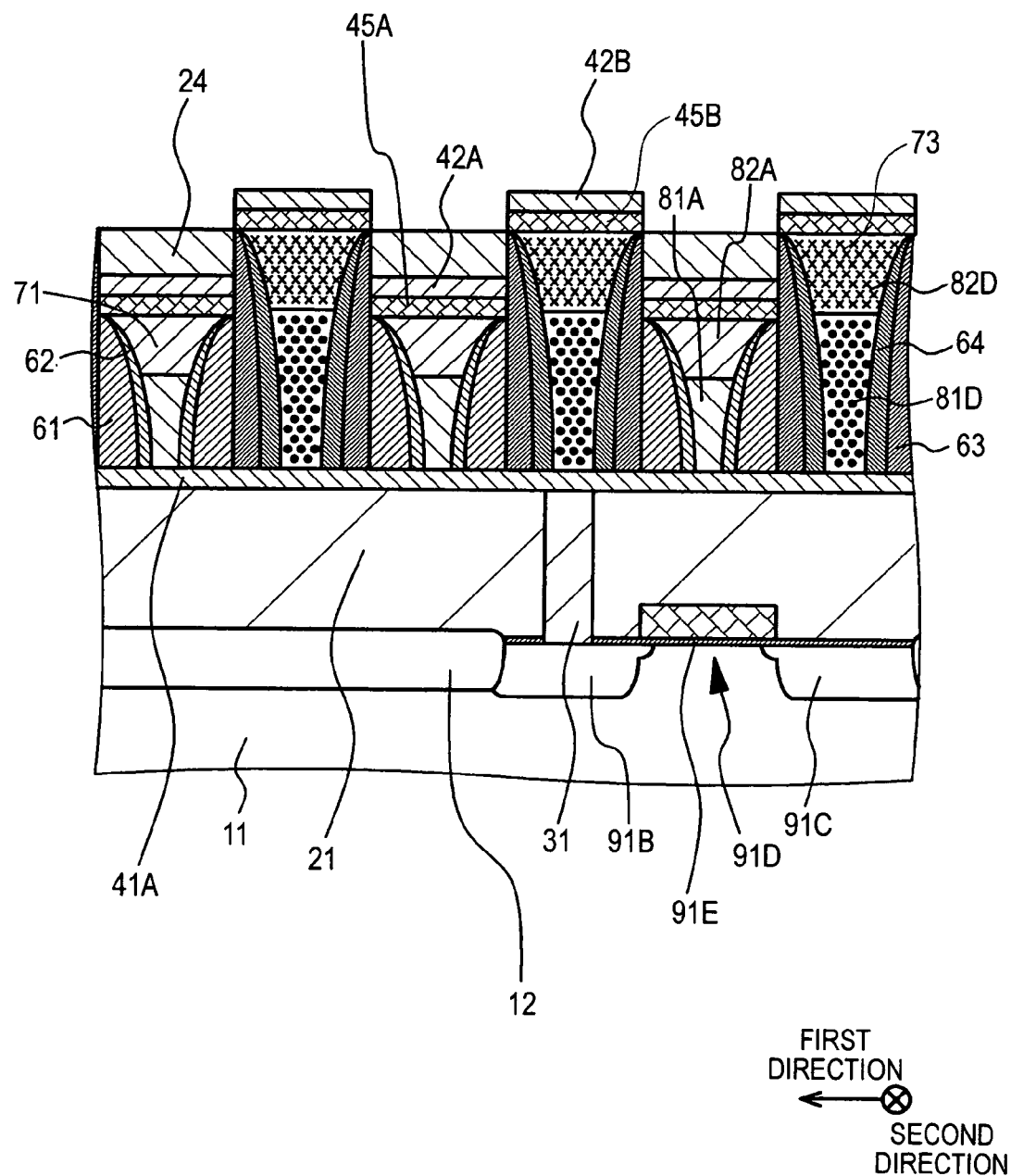
FIG. 17 is a schematic partial sectional view of the cross-point semiconductor memory device according to the Embodiment 3 along the first direction.
Figure 18:
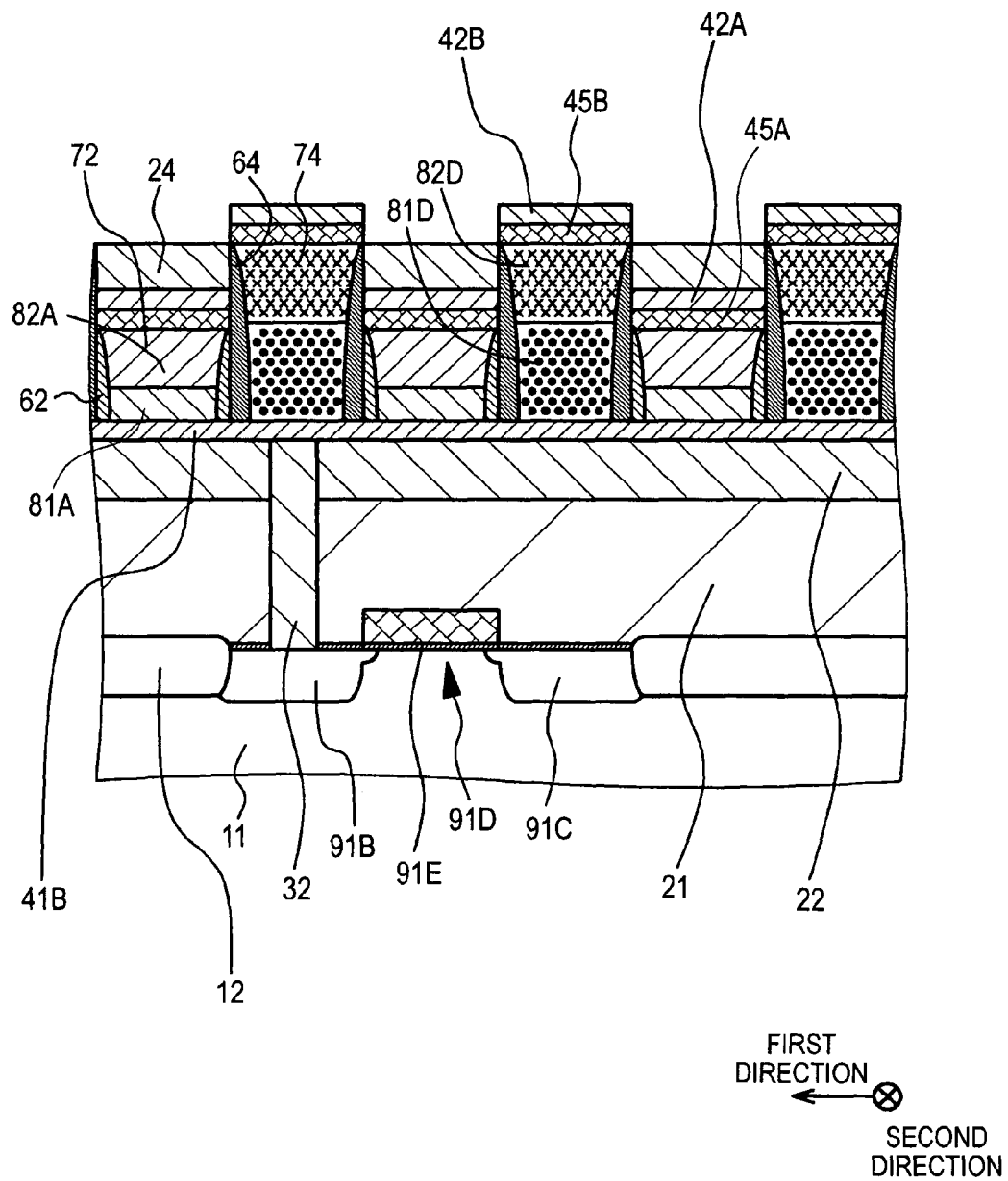
FIG. 18 is a schematic partial sectional view, different from FIG. 17, of the cross-point semiconductor memory device according to the Embodiment 3 along the first direction.
Figure 19A:
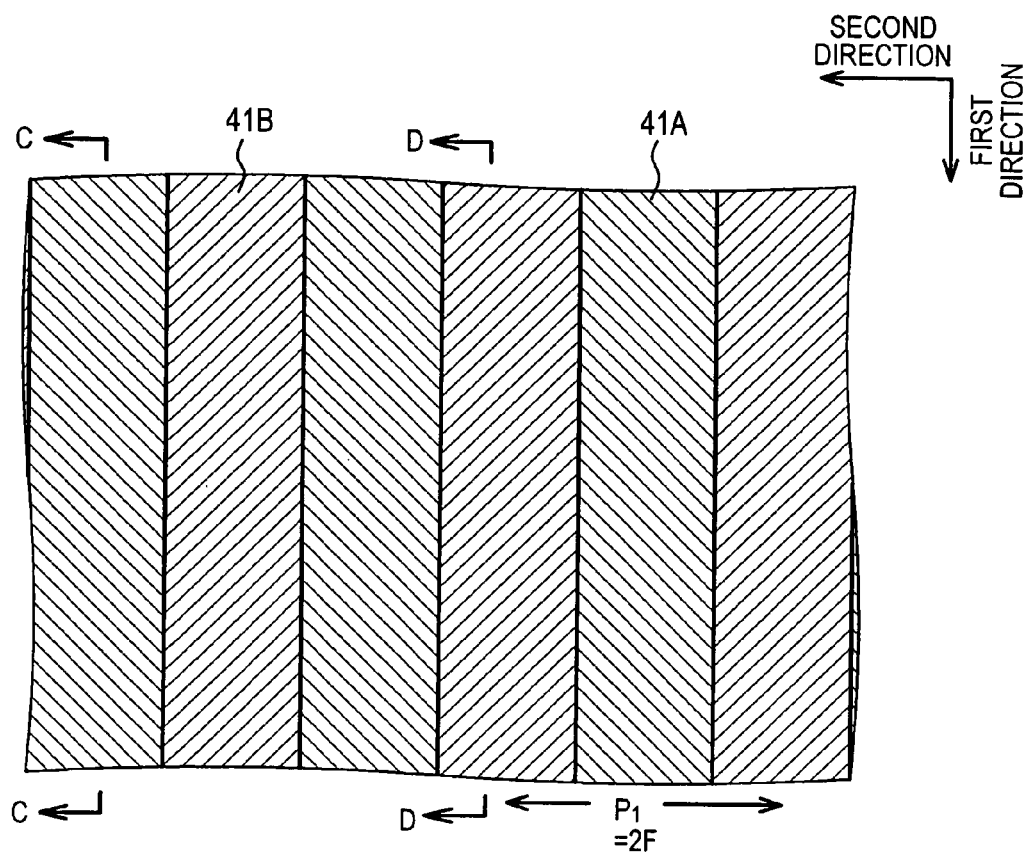
FIGS. 19A and 19B are diagrams schematically showing the arrangement states of first wirings and second wirings in the cross-point semiconductor memory device according to the Embodiment 3, respectively.
Figure 19B:
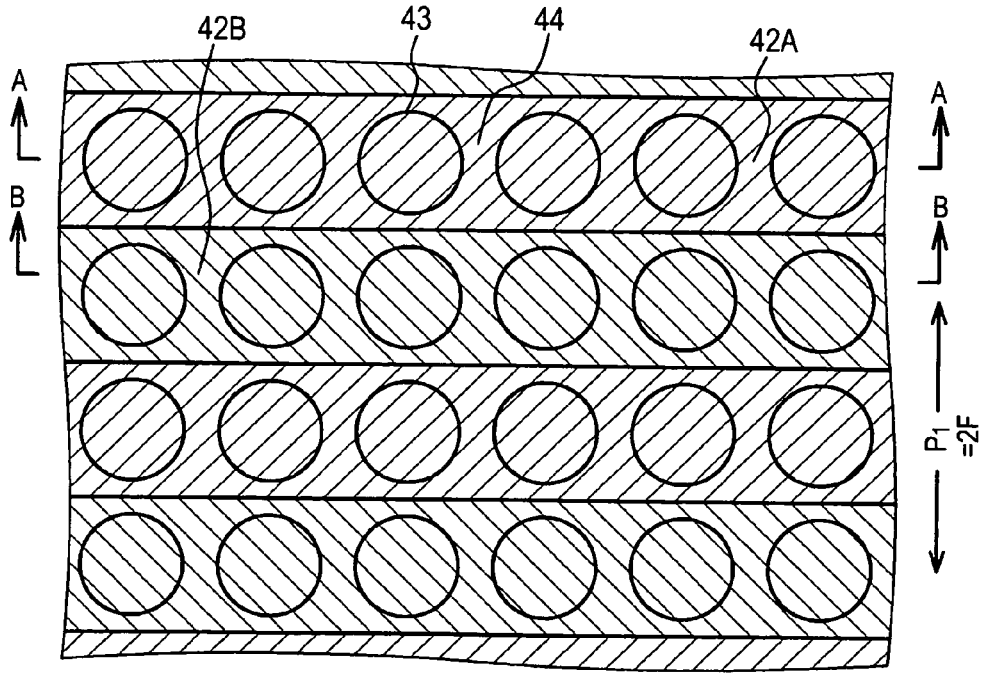
Figure 20A:
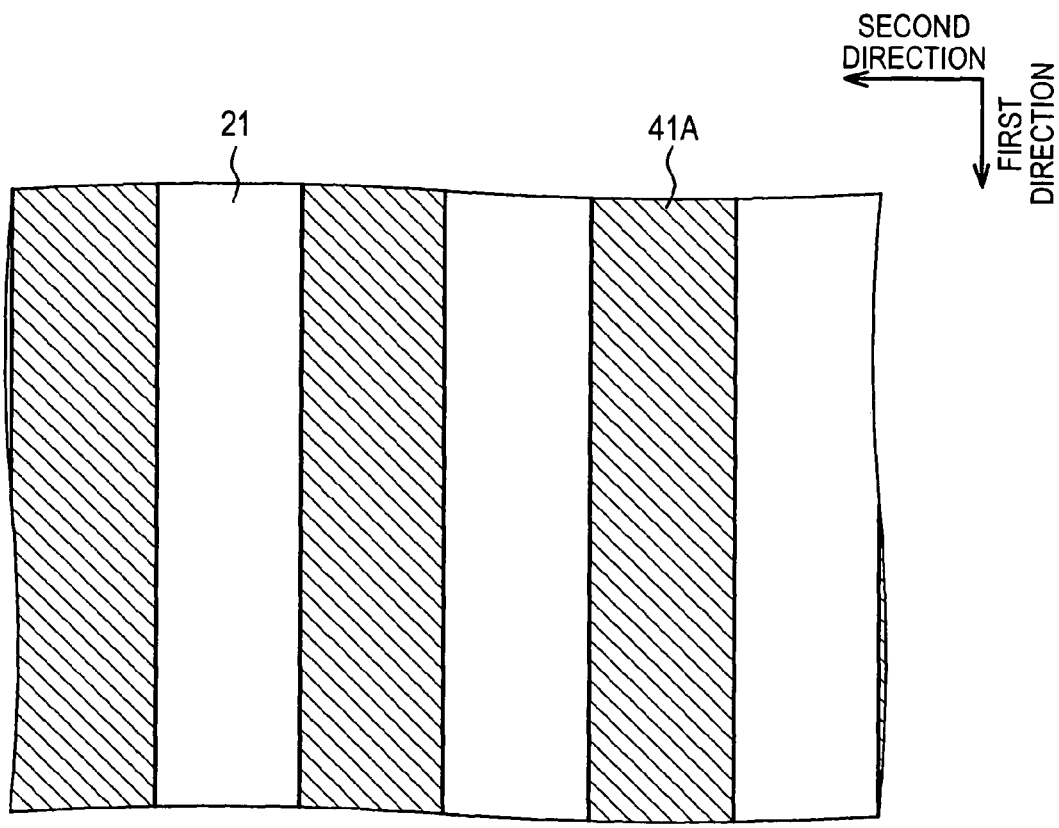
FIGS. 20A and 20B are diagrams schematically showing the arrangement states of odd-numbered first wirings and even-numbered first wirings in the cross-point semiconductor memory device according to the Embodiment 3, respectively.
Figure 20B:
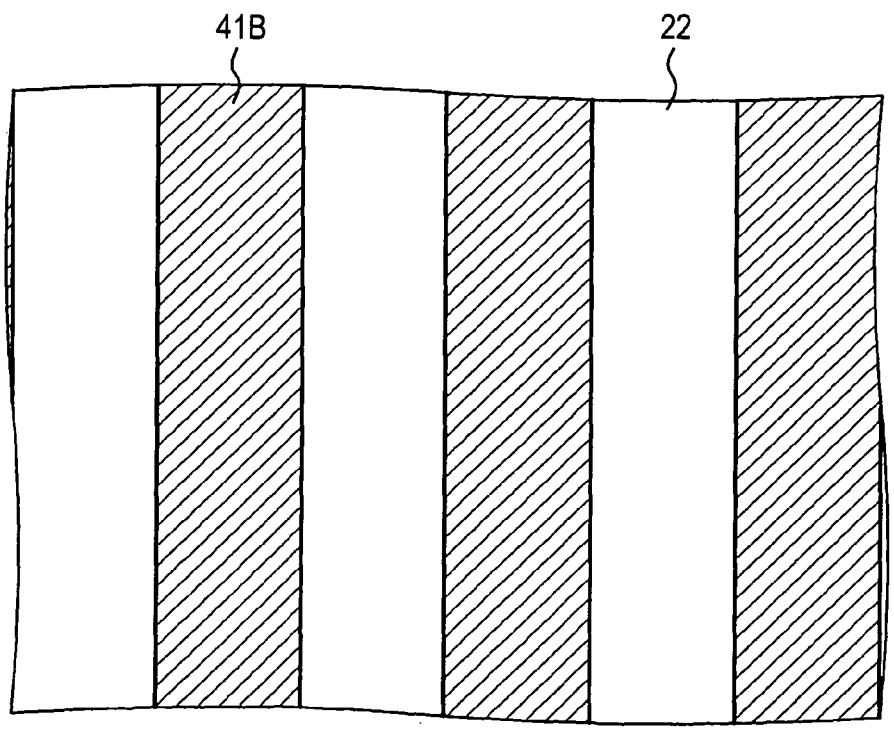
Figure 21A:
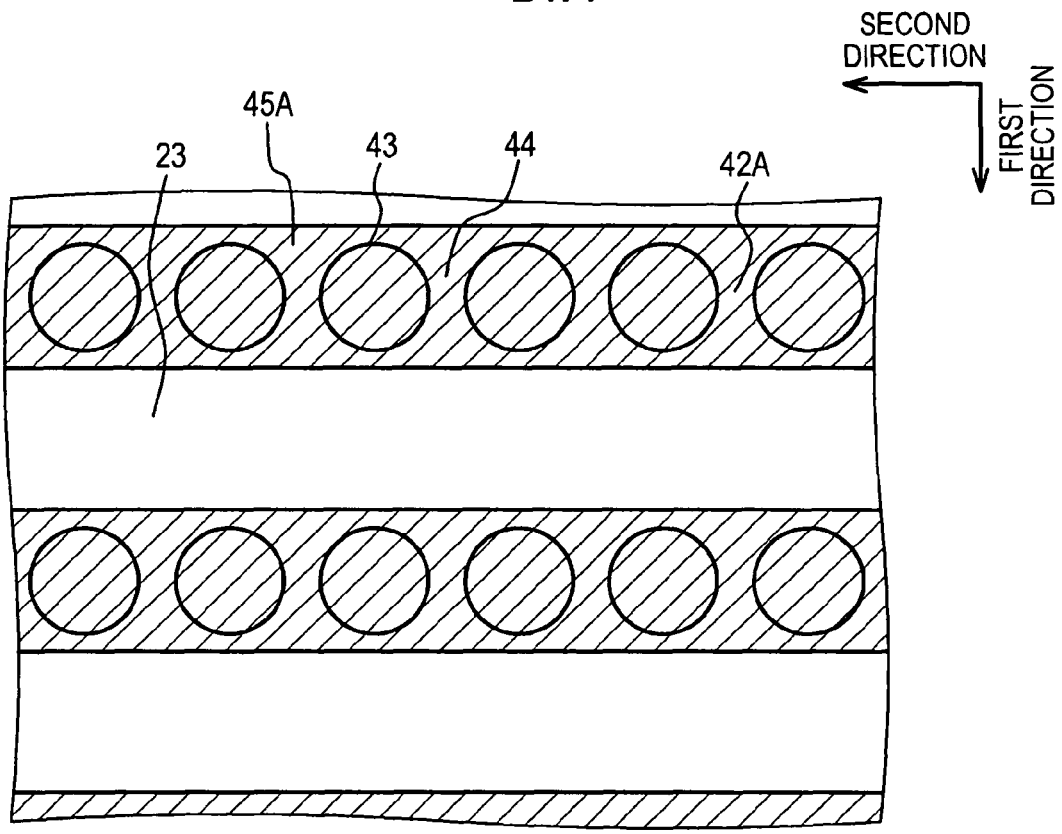
FIGS. 21A and 21B are diagrams schematically showing the arrangement states of odd-numbered second wirings and even-numbered second wirings in the cross-point semiconductor memory device according to the Embodiment 3, respectively.
Figure 21B:
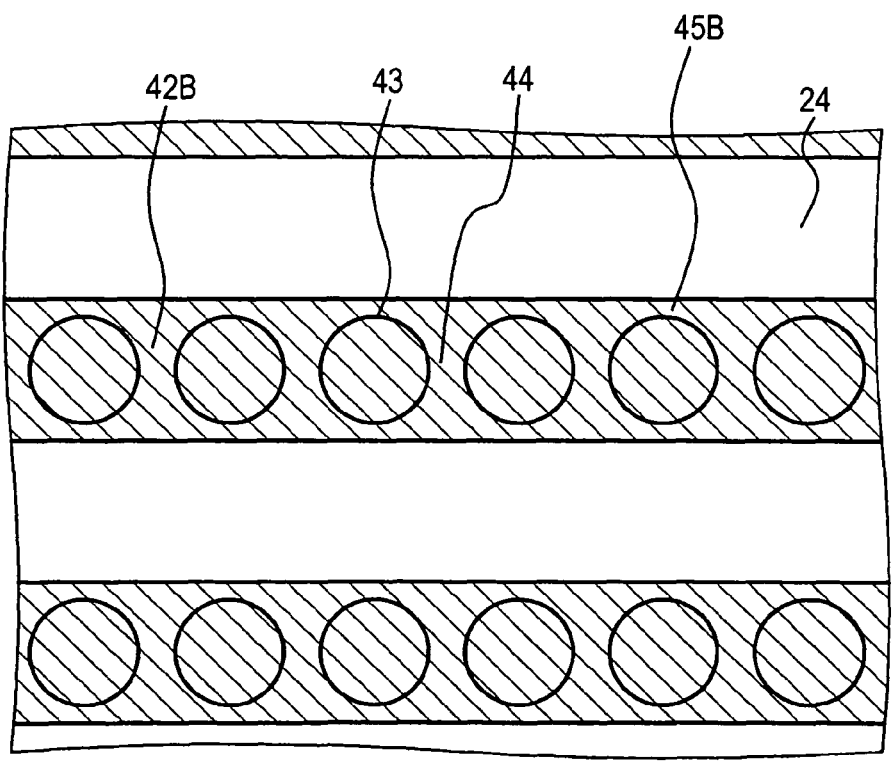

Embodiment 3 is also a modification of the Embodiment 1 and relates to the cross-point semiconductor memory device according to the second embodiment. FIGS. 15 and 16 are schematic partial sectional views of a cross-point semiconductor memory device of the Embodiment 3 along the second direction. FIGS. 17 and 18 are schematic partial sectional views of the cross-point semiconductor memory device of the Embodiment 3 along the first direction. FIGS. 19A and 19B schematically show the arrangement states of first wirings and second wirings in the cross-point semiconductor memory device of the Embodiment 3, respectively. FIGS. 20A and 20B schematically show the arrangement states of odd-numbered first wirings and even-numbered first wirings, respectively. FIGS. 21A and 21B schematically show the arrangement states of odd-numbered second wirings and even-numbered second wirings, respectively. FIG. 15 is a schematic partial sectional view taken along the line A-A of FIG. 19B. FIG. 16 is a schematic partial sectional view taken along the line B-B of FIG. 19B. FIG. 17 is a schematic partial sectional view taken along the line C-C of FIG. 19A. FIG. 18 is a schematic partial sectional view taken along the line D-D of FIG. 19A.

In the cross-point semiconductor memory device of the Embodiment 3 and the like, odd-numbered second wirings 42A and even-numbered second wirings 42B are arranged on different insulating interlayers 24 and 25 in the up-down direction. The arrangement state of the odd-numbered second wirings 42A and the arrangement state of the even-numbered second wirings 42B are out of alignment by half of an arrangement pitch ($P_2$) of the odd-numbered and even-numbered second wirings 42A or 42B, respectively. The arrangement pitch $P_2$ of the odd-numbered or even-numbered second wirings 42A or 42B is two times larger than the minimum process dimension F. The odd-numbered second wirings 42A arranged in a line-and-stripe shape have a width equal to the minimum process dimension F, and a distance between the second wiring 42A and the second wiring 42A is equal to the minimum process dimension F. The even-numbered second wirings 42B arranged in a line-and-stripe shape have a width equal to the minimum process dimension F, and a distance between the second wiring 42B and the second wiring 42B is equal to the minimum process dimension F. In the cross-point semiconductor memory device of the Embodiment 3 and the like, projection images of the odd-numbered second wirings 42A and projection images of the even-numbered second wirings 42B do not overlap each other and have no gap (see FIG. 19B). The projection images of the first wirings 41A and 41B and the projection images of the second wirings 42A and 42B are orthogonal to each other.

In the Embodiment 3, the first wirings 41A and 41B are positioned below the second wirings 42A and 42B. Adjacent memory parts 43 in the second direction are connected to each other by the memory extension part 44.

In the cross-point semiconductor memory device of the Embodiment 3 and the like, the odd-numbered second wirings 42A are formed on a memory layer 45A, and a second memory layer 45B and the even-numbered second wirings 42B are formed on the fourth insulating interlayer 24 covering the odd-numbered second wirings 42A and the third insulating interlayer 23. The memory parts composed of the second memory layer are connected to the odd-numbered first wirings 41A through third connection holes 73 provided in the fourth insulating interlayer 24, the third insulating interlayer 23, and the second insulating interlayer 22. The memory parts composed of the second memory layer 45B are connected to the even-numbered first wirings 41B through fourth connection holes 74 provided in the fourth insulating interlayer 24 and the third insulating interlayer 23. The third connection holes 73 and the fourth connection holes 74 function as diodes. Specifically, the third connection holes 73 and the fourth connection holes 74 each have a semiconductor layer area containing an impurity of a first conduction type (for example, a semiconductor layer area 82D containing a p-type impurity) and a semiconductor layer area containing an impurity of a second conduction type different from the first conduction type (for example, a semiconductor layer area 81D containing an n-type impurity).

The third connection holes 73 can be obtained by forming third openings in the portions of the second insulating interlayer 22, the third insulating interlayer 23, and the fourth insulating interlayer 24 between portions where the even-numbered second wirings 42A are to be formed and the odd-numbered first wiring 41A, forming third sidewalls 63 at the sidewall parts of the third openings to reduce the third openings, and filling conductive materials 82D and 81D in the third openings. The fourth connection holes 74 can be obtained by forming fourth openings in the portions of the third insulating interlayer 23 and the fourth insulating interlayer 24 between the portions where the even-numbered second wirings 42B are to be formed and the even-numbered first wirings 41B, forming fourth sidewalls 64 at the sidewall parts of the fourth openings to reduce the diameter of the fourth openings, and filling conductive materials 82D and 81D in the fourth openings.

[Step-300]

After [Step-100] to [Step-140] of the Embodiment 1 are executed, the memory parts 43 (specifically, the memory layer 45) are formed on the entire surface of the third insulating interlayer 23 so as to seal the first connection holes 71 and the second connection holes 72. Specifically, the memory layer 45 is formed on the third insulating interlayer 23 including the top surfaces of the first connection holes 71 and the second connection holes 72 by sputtering. Thereafter, the odd-numbered second wirings 42A arranged in a line-and-stripe shape and the memory layer 45A are formed on the memory layer 45 in the same manner as [Step-150] of the Embodiment 1.

[Step-310]

Next, the fourth insulating interlayer 24 made of $SiO_2$ is formed on the entire surface by the CVD method, and the third openings are formed in the portions of the second insulating interlayer 22, the third insulating interlayer 23, and the fourth insulating interlayer 24 between the portions where the even-numbered second wirings 42B are to be formed and the odd-numbered first wirings 41A. Then, the third sidewalls 63 are formed at the sidewall parts of the third openings to reduce the diameter of the third openings. Next, the fourth openings are formed in the portions of the third insulating interlayer 23 and the fourth insulating interlayer 24 between the portions where the even-numbered second wirings 42B are to be formed and the even-numbered first wirings 41B. Then, the fourth sidewalls 64 are formed at the sidewall parts of the fourth openings to reduce the diameter of the fourth openings. This step may be substantially the same as [Step-140A] and [Step-140B] of the Embodiment 1. Thereafter, the third openings and the fourth openings are filled with the conductive materials 82D and 81D to obtain the third connection holes 73 and the fourth connection holes 74.

[Step-320]

Next, the even-numbered second wirings 42B are formed on the fourth insulating interlayer 24 so as to seal the third connection holes 73 and the fourth connection holes 74. Specifically, the second memory layer 45B, a cohesive layer (not shown) made of Ti or TiN, and a conductive material layer made of tungsten (W) are sequentially formed on the fourth insulating interlayer 24 including the top surfaces of the third connection holes 73 and the fourth connection holes by sputtering and then patterned by photolithography and dry etching. Thus, a laminated structure of the second wirings 42B and the second memory layer 45B shown in FIGS. 15 to 19 can be obtained.

According to the cross-point semiconductor memory device of the Embodiment 3 or the method of manufacturing the same, the odd-numbered second wirings 42A and the even-numbered second wirings 42B are arranged on different insulating interlayers 23 and 24 (specifically, on the memory layer 45A and the second memory layer 45B) in the up-down direction. Therefore, when the memory parts 43 are formed with a pitch of the minimum process dimension F defined by the design rule of the manufacturing process, the pitch $P_2$ of the odd-numbered second wirings 42A can be set to 2F, and the pitch $P_2$ of the even-numbered second wirings 42B can be set to 2F. That is, when the second wirings are viewed as a whole, the pitch of the second wirings can be set to F. As a result, the memory cells having the first wirings, the memory parts, and the second wirings can have a size of $F^2$, and a higher-density semiconductor memory device can be realized.

The invention has been described with reference to the preferred embodiments, but the invention is not limited to the embodiments. The configuration, structure, materials used, and the like of the cross-point semiconductor memory device described in the embodiments are for illustration and may be appropriately changed. Although in the embodiments, a structure has been described in which the memory parts 43 are formed on the top surfaces of the openings 51 and 53, a structure may be adopted in which the memory parts 43 enter the upper parts of the openings 51 and 53. The semiconductor layer area 82 containing the p-type impurity and the semiconductor layer area 81 containing the n-type impurity for forming a diode may be reversed vertically. In this case, the direction in which a current flows should be opposite to the direction described in the embodiments. That is, a current should flow from the drive transistor 91 to the transistor 92 for a peripheral circuit.

Figure 22:
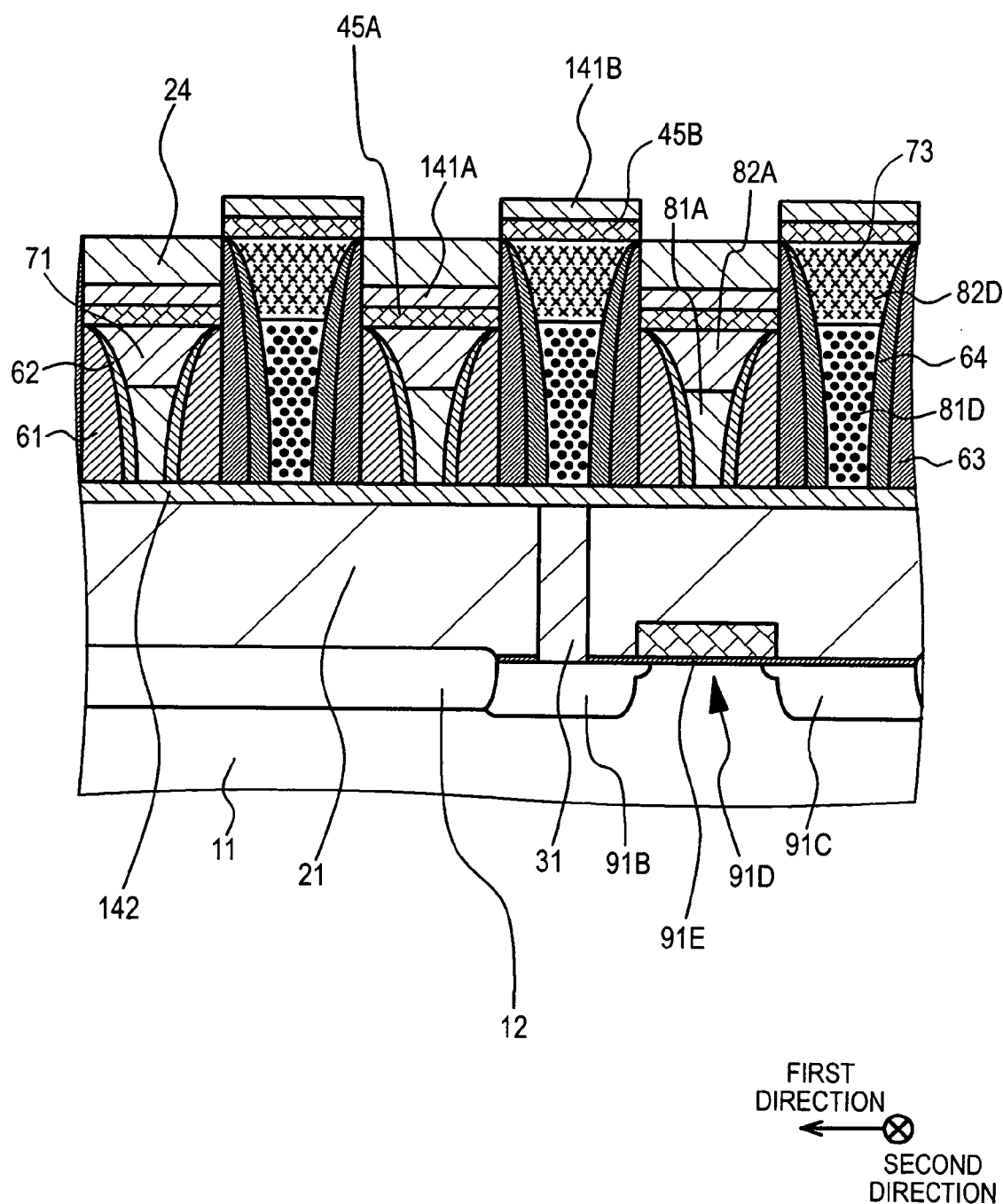
FIG. 22 is a schematic partial sectional view of a modification of the cross-point semiconductor memory device according to the Embodiment 1 along the second direction.
Figure 23:
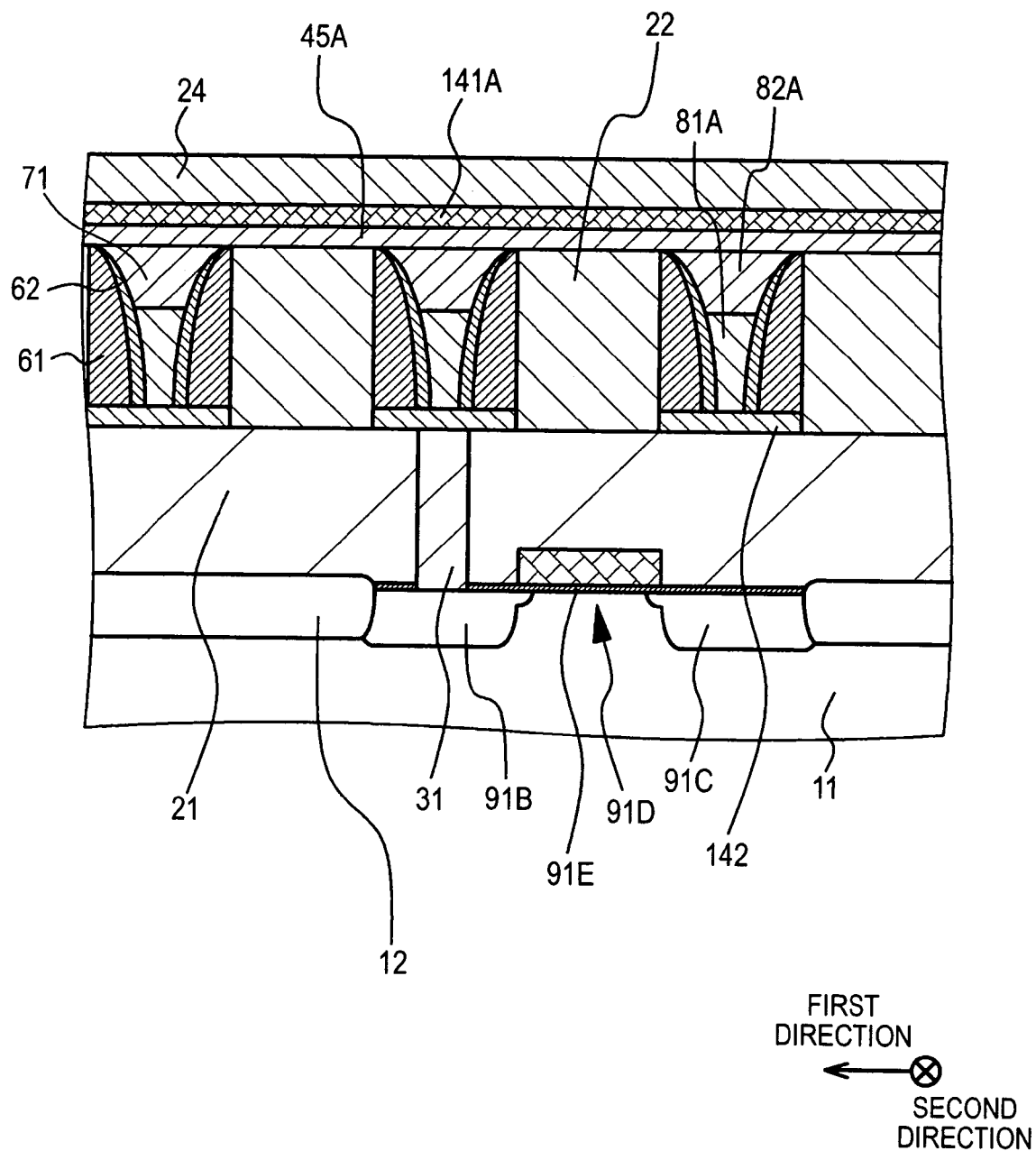
FIG. 23 is a schematic partial sectional view of the modification of the cross-point semiconductor memory device according to the Embodiment 1 along the first direction.
Figure 24:
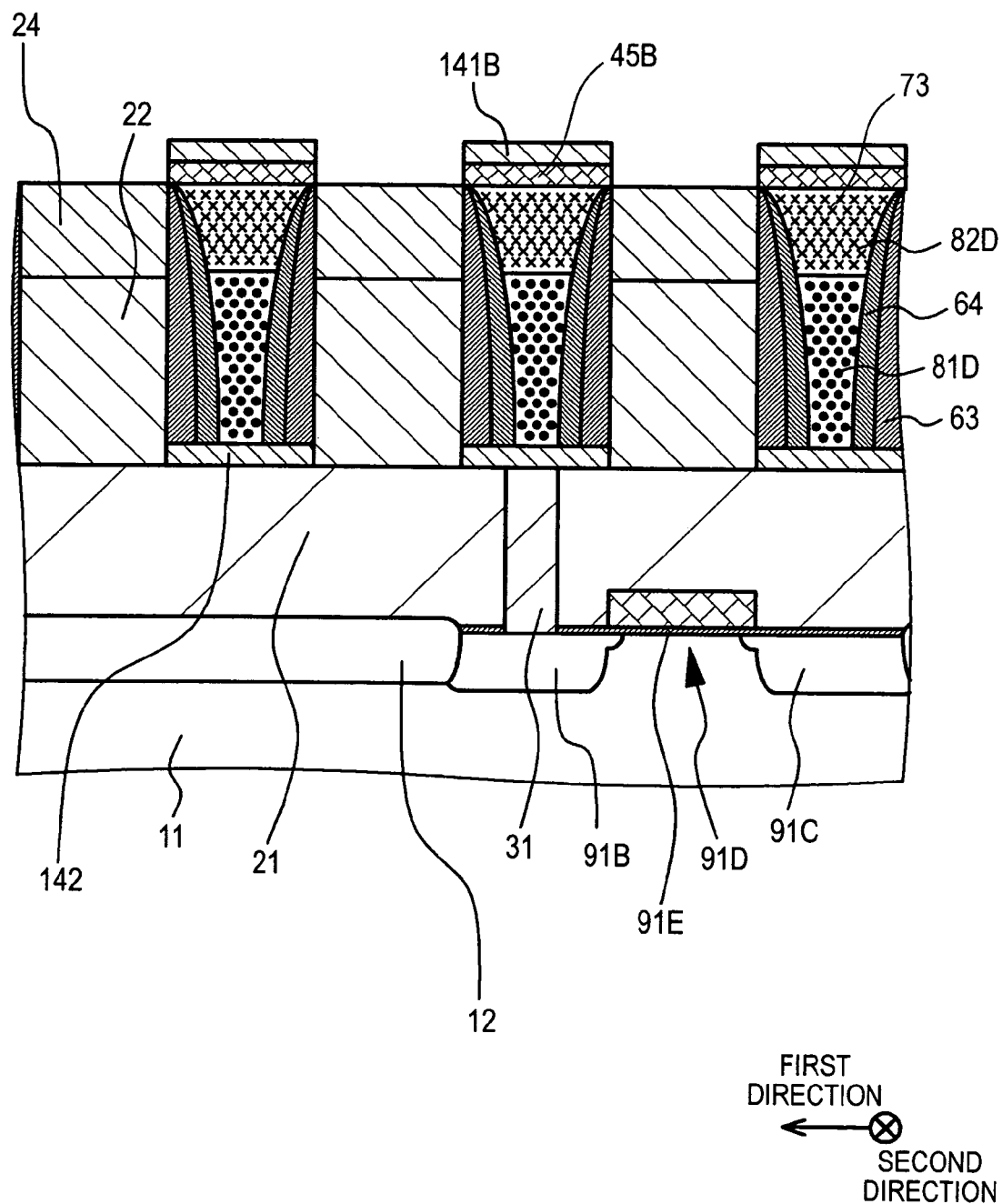
FIG. 24 is a schematic partial sectional view, different from FIG. 23, of the modification of the cross-point semiconductor memory device according to the Embodiment 1 along the first direction.
Figure 25A:
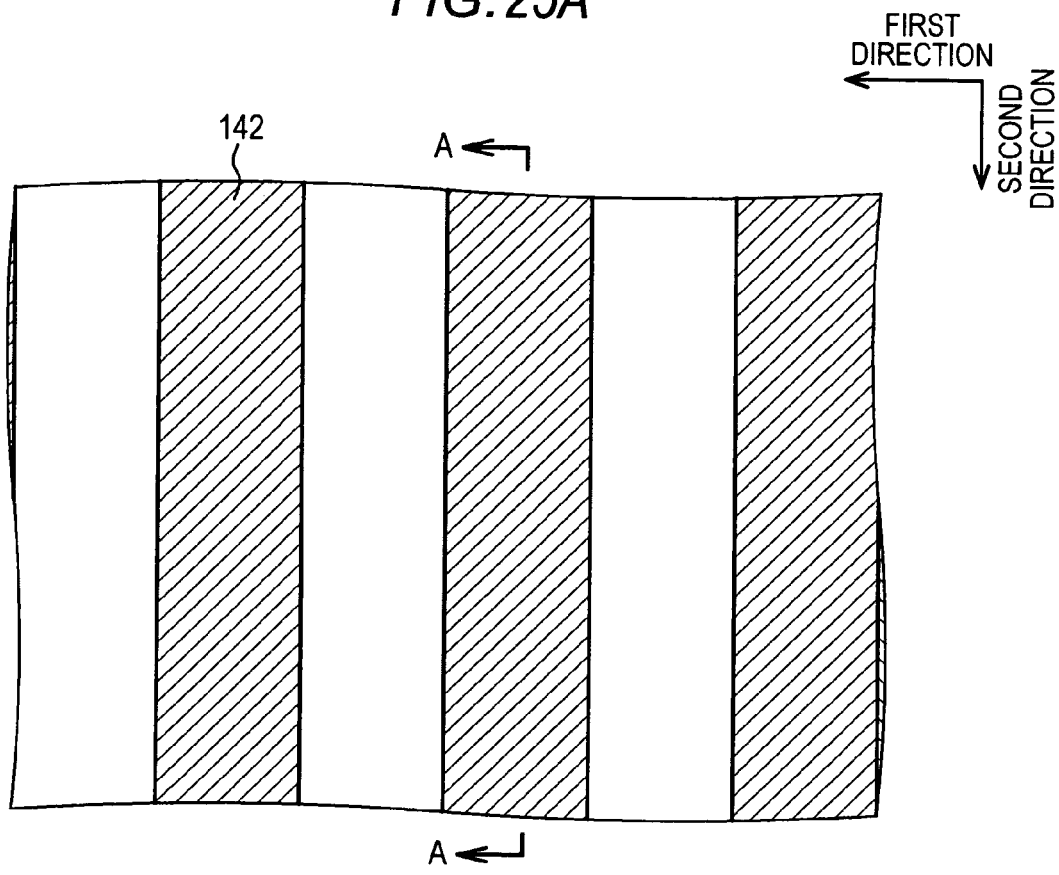
FIGS. 25A and 25B are diagrams schematically showing the arrangement states of second wirings and first wirings in the modification of the cross-point semiconductor memory device according to the Embodiment 1, respectively.
Figure 25B:
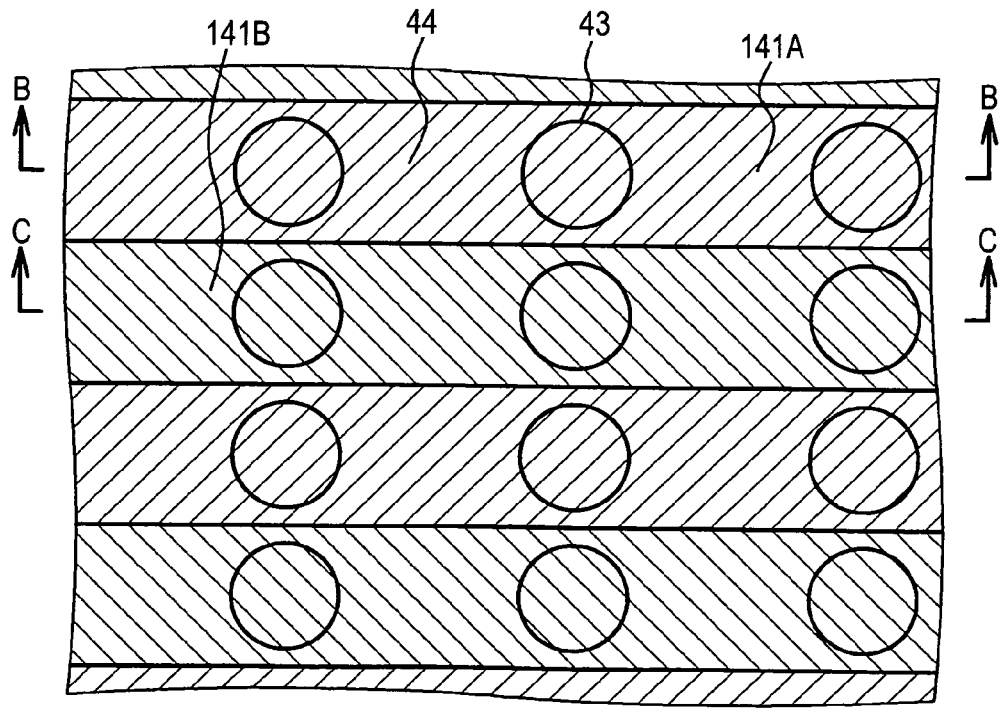
Figure 26:
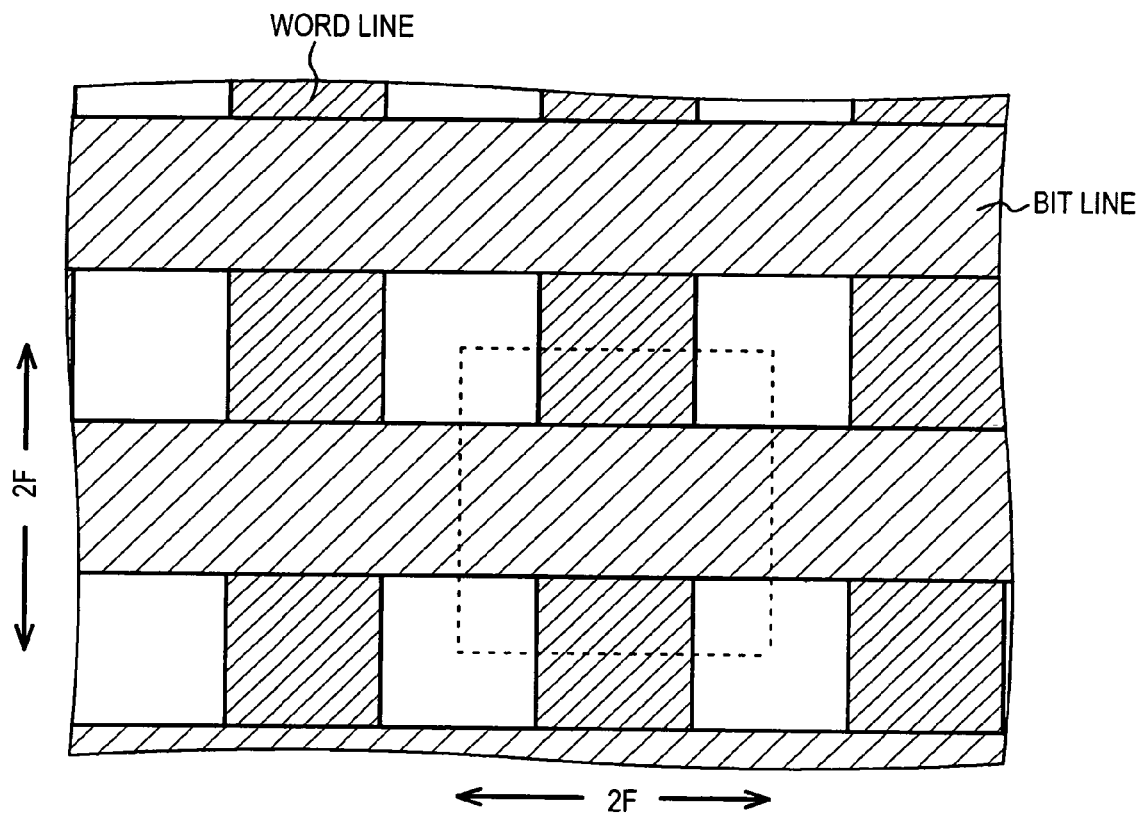
FIG. 26 is a diagram schematically showing an arrangement example of word lines, bit lines, and memory parts in the existing cross-point semiconductor memory device.

Although in the embodiments, the first wirings are positioned below the second wirings, the first wirings may be positioned above the second wirings. FIG. 22 is a schematic partial sectional view of such a cross-point semiconductor memory device along the second direction. FIGS. 23 and 24 are schematic partial sectional views of such a cross-point semiconductor memory device along the first direction. FIG. 25A schematically shows the arrangement state of the second wirings, and FIG. 25B schematically shows the arrangement state of the odd-numbered first wirings and the even-numbered first wirings. FIG. 22 is a schematic partial sectional view taken along the line A-A of FIG. 25A. FIG. 23 is a schematic partial sectional view taken along the line B-B of FIG. 25B. FIG. 24 is a schematic partial sectional view taken along the line C-C of FIG. 25B. In FIGS. 25A and 25B, in order to show the odd-numbered first wirings, the even-numbered first wirings, and the second wirings explicitly, these wirings are shaded. In FIG. 25B, in order to show the memory parts explicitly, the outer edges of places corresponding to the memory parts are circled. In such a cross-point semiconductor memory device, the odd-numbered first wirings 141A and the even-numbered first wirings 141B may be substantially identical to the odd-numbered second wirings 42A and the even-numbered second wirings 42B in the cross-point semiconductor memory device of the Embodiment 3. The second wirings 142 and the memory parts 43 may be substantially connected to each other by the first connection holes 71 and the third connection holes 73 in the cross-point semiconductor memory device of the Embodiment 3. The second wirings 42 and the drive transistors 91 formed on the second insulating interlayer 22 may be substantially connected to each other by the first connection parts 31 in the cross-point semiconductor memory device of the Embodiment 1.

It should be understood by those skilled in the art that various modifications, combinations, sub-combinations and alterations may occur depending on design requirements and other factors insofar as they are within the scope of the appended claims or the equivalents thereof.

What is claimed is:

1. A cross-point semiconductor memory device comprising:
   a plurality of first wirings extending in a first direction;
   a plurality of second wirings positioned on a layer different from the first wirings to extend in a second direction different from the first direction; and
   memory parts provided in overlap areas of the first wirings and the second wirings,
   wherein the odd-numbered first wirings and the even-numbered first wirings are arranged on different insulating interlayers in an up-down direction.

2. The cross-point semiconductor memory device according to claim 1,
   wherein the arrangement state of the odd-numbered first wirings and the arrangement state of the even-numbered first wirings are out of alignment by half of an arrangement pitch of the odd-numbered or even-numbered first wirings, respectively.

3. The cross-point semiconductor memory device according to claim 2,
   wherein the arrangement pitch of the odd-numbered or even-numbered first wirings is two times larger than a minimum process dimension.

4. The cross-point semiconductor memory device according to claim 1,
   wherein projection images of the odd-numbered first wirings and projection images of the even-numbered first wirings do not overlap each other and have no gap.

5. The cross-point semiconductor memory device according to claim 2,
   wherein the first wirings are positioned below the second wirings,
   adjacent memory parts in the second direction are connected to each other by a memory extension part, and
   the second wirings and a memory layer having the memory parts and the memory extension parts have a laminated structure.

6. The cross-point semiconductor memory device according to claim 5, further comprising:
   drive transistors connected to the first wirings and formed on a semiconductor substrate,
   wherein the odd-numbered first wirings are formed on a first insulating interlayer covering the drive transistors,
   the even-numbered first wirings are formed on a second insulating interlayer covering the first insulating interlayer and the odd-numbered first wirings,
   the memory layer is formed on a third insulating interlayer covering the second insulating interlayer and the even-numbered first wirings,
   the odd-numbered first wirings and the memory parts are connected to each other through first connection holes provided in the second insulating interlayer and the third insulating interlayer, and
   the even-numbered first wirings and the memory parts are connected to each other through second connection holes provided in the third insulating interlayer.

7. The cross-point semiconductor memory device according to claim 6,
   wherein the first connection holes and the second connection holes function as diodes.

8. The cross-point semiconductor memory device according to claim 7,
   wherein the first connection holes and the second connection holes each have a semiconductor layer area containing an impurity of a first conduction type and a semiconductor layer area containing an impurity of a second conduction type different from the first conduction type.

9. The cross-point semiconductor memory device according to claim 6,
   wherein each of the drive transistors is a field effect transistor,
   the width of a channel forming area of the drive transistor is at least 1.5 times larger than an arrangement pitch of the odd-numbered or even-numbered first wirings, and a width direction of the channel forming area of the drive transistor is parallel to the second direction,
   one source/drain area of the drive transistors is connected to the odd-numbered first wirings through connection parts provided in the first insulating interlayer, or connected to the even-numbered first wirings through connection parts provided in the first insulating interlayer and the second insulating interlayer, and
   the other source/drain area of the drive transistors is connected to a power supply or grounded.

10. The cross-point semiconductor memory device according to claim 1,
    wherein the odd-numbered second wirings and the even-numbered second wirings are arranged on different insulating interlayers in the up-down direction.

11. The cross-point semiconductor memory device according to claim 10,
wherein the arrangement state of the odd-numbered second wirings and the arrangement state of the even-numbered second wirings are out of alignment by half of an arrangement pitch of the odd-numbered and even-numbered second wirings, respectively.

12. The cross-point semiconductor memory device according to claim 11,
wherein the arrangement pitch of the odd-numbered or even-numbered second wirings is two times larger than a minimum process dimension.

13. The cross-point semiconductor memory device according to claim 10,
wherein projection images of the odd-numbered second wirings and projection images of the even-numbered second wirings do not overlap each other and have no gap.

14. The cross-point semiconductor memory device according to claim 10,
wherein the first wirings are positioned below the second wirings, and
adjacent memory parts in the second direction are connected to each other by a memory extension part.

15. The cross-point semiconductor memory device according to claim 1,
wherein the first wirings, the memory parts, and the second wirings form a phase-change memory.

16. A method of manufacturing a cross-point semiconductor memory device,
wherein the cross-point semiconductor memory device includes
a plurality of first wirings extending in a first direction,
a plurality of second wirings positioned on a layer different from the first wirings to extend in a second direction different from the first direction, and
memory parts provided in overlap areas of the first wirings and the second wirings,
the odd-numbered first wirings and the even-numbered first wirings are arranged on different insulating interlayers in an up-down direction,
the first wirings are positioned below the second wirings, and
the arrangement state of the odd-numbered first wirings and the arrangement state of the even-numbered first wirings are out of alignment by half of an arrangement pitch of the odd-numbered and even-numbered first wirings, respectively, and
the method comprising the steps of:
forming drive transistors on a semiconductor substrate;
forming a first insulating interlayer on the entire surface and forming the odd-numbered first wirings electrically connected to the odd-numbered drive transistors on the first insulating interlayer;
forming a second insulating interlayer on the entire surface and forming the even-numbered first wirings electrically connected to the even-numbered drive transistors on the second insulating interlayer;
forming a third insulating interlayer on the entire surface;
forming first openings in the second insulating interlayer and the third insulating interlayer above the odd-numbered first wirings, forming first sidewalls at the sidewall parts of the first openings to reduce the diameter of the first openings, forming second openings in the third insulating interlayer above the even-numbered first wirings, forming second sidewalls at the sidewall parts of the second openings to reduce the diameter of the second openings, filling a conductive material in the first openings to form first connection holes, and filling a conductive material in the second openings to form second connection holes; and
forming the memory parts and the second wirings on the third insulating interlayer so as to seal the first connection holes and the second connection holes.

* * * * *